(12) United States Patent
Clarke

(10) Patent No.: US 6,262,943 B1
(45) Date of Patent: Jul. 17, 2001

(54) SIGNAL PROCESSING SYSTEM FOR SENSING A PERIODIC SIGNAL IN NOISE

(75) Inventor: Ira J Clarke, Malvern (GB)

(73) Assignee: The Secretary of State for Defence in Her Britannic Majesty's Government of the United Kingdom of Great Britain and Northern Ireland, Farnborough (GB)

( * ) Notice: Subject to any disclaimer, the term of this patent is extended or adjusted under 35 U.S.C. 154(b) by 0 days.

(21) Appl. No.: 09/463,663

(22) PCT Filed: Aug. 27, 1998

(86) PCT No.: PCT/GB98/02566

§ 371 Date: Jan. 28, 2000

§ 102(e) Date: Jan. 28, 2000

(87) PCT Pub. No.: WO99/10715

PCT Pub. Date: Mar. 4, 1999

(30) Foreign Application Priority Data

Aug. 27, 1997 (GB) .................................................. 9718026

(51) Int. Cl.[7] ................................. G01H 1/00; H04B 1/06
(52) U.S. Cl. ............................................. 367/135; 367/901
(58) Field of Search ................................... 367/135, 901; 700/280; 702/191

(56) References Cited

U.S. PATENT DOCUMENTS 5,566,134 10/1996 Dufault ................................. 367/135

FOREIGN PATENT DOCUMENTS 0 683 398    8/1994 (EP) .

OTHER PUBLICATIONS

Philips, "Adaptive Noise Removal from Biomedical Signals Using Warped Polynomials" IEEE Transactions on Biomedical Engineeing vol. 43, No. 5, May 1996.

Gruber et al, "Estimation of Quasiperiodic Signal Parameters by Means of Dynamic Signal Models" IEEE Transactions on Signal Processing 42 (1994) Mar. No. 3.

Primary Examiner—Daniel T. Pihulic
(74) Attorney, Agent, or Firm—Nixon & Vanderhye P.C.

(57) ABSTRACT

A method and an apparatus for distinguishing systematic artifacts from noise involves localizing functional noise in the vicinity of predicted functional peaks. The method is particularly relevant to detection and tracking of time-varying signals. An apparatus implementing such an application of the method comprises a detection system (50) which monitors each component of a multi-component periodic signal via its basis repeat unit: a cyclet, of periodicity τ. The signal is digitized and clocked through the system (50) in segments. A cyclet remover (62) subtracts predicted values of previously detected cyclets from the incoming signal segment to produce a residual signal. A cyclet detector (60) uses a sliding window procedure to detect further cyclets in this residual and to measure their amplitude profiles $\bar{b}(\tau)$ and periodicities (τ). A cyclet tracker (64) uses this residual to correct errors in the predicted cyclet values $(\bar{b}(\tau), \tau)$ and to predict (track) cyclet values appropriate to the next incoming signal segment. A track remover (66) monitors cyclets variations and removes sub-threshold cyclets from the tracking process.

50 Claims, 2 Drawing Sheets

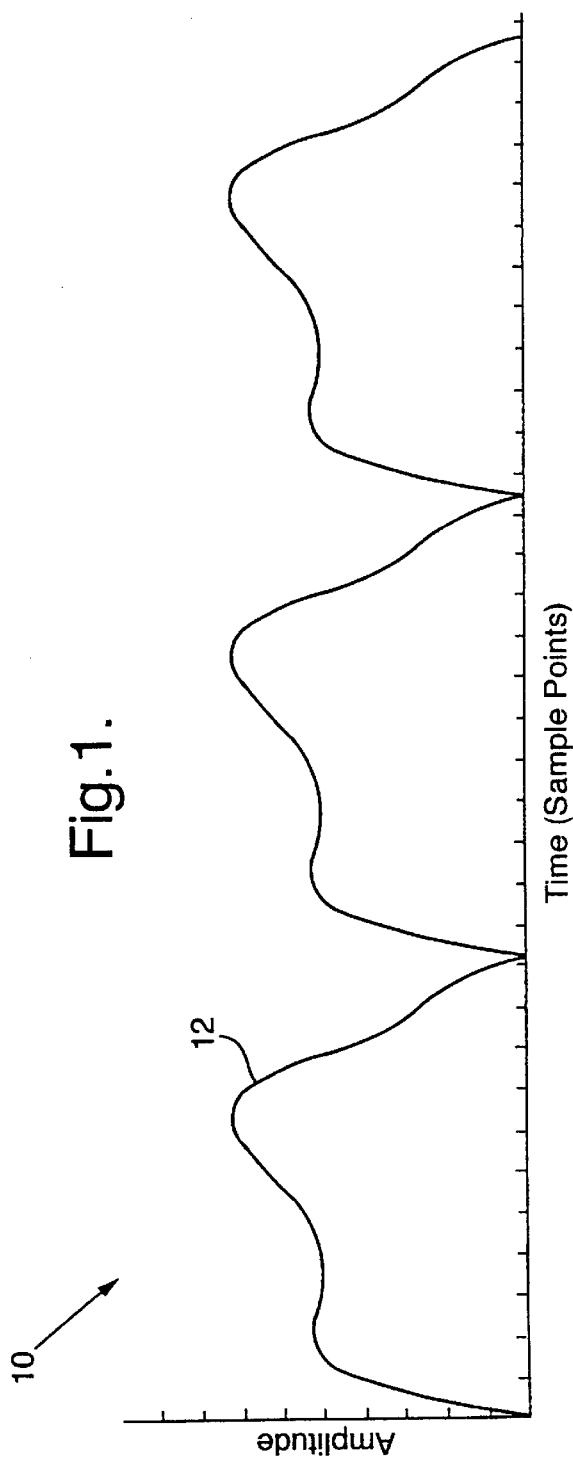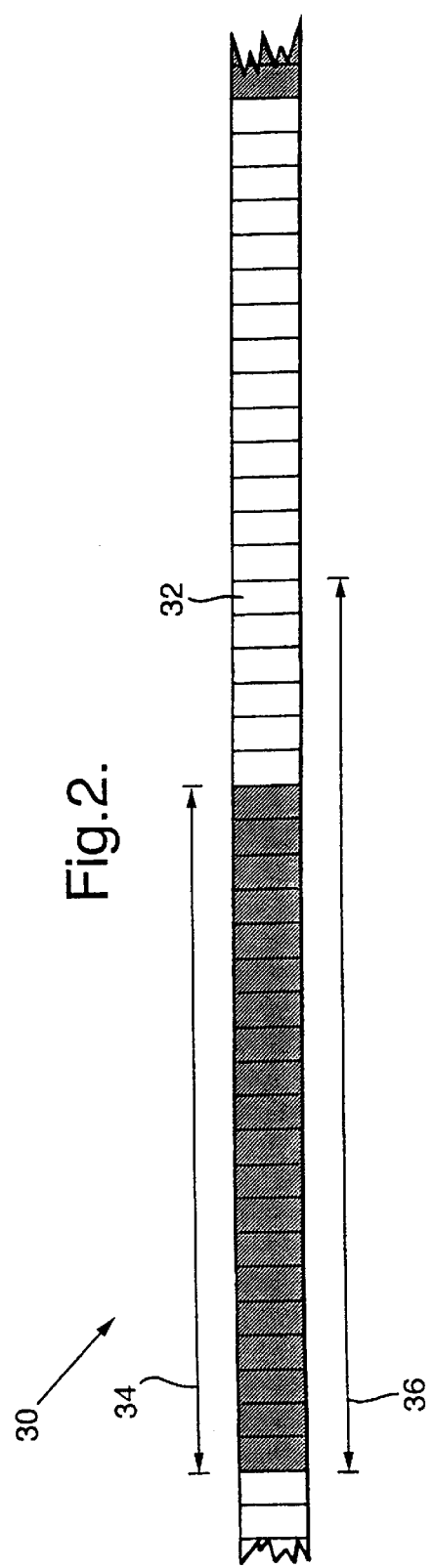

SIGNAL PROCESSING SYSTEM FOR SENSING A PERIODIC SIGNAL IN NOISE

This invention relates to a method of localising noise effects and to a signal processing system for applying the method. The invention also relates to applications of the signal processing system in signal detection and tracking system associated with analysis of multicomponent signals.

Regardless of the source of a signal, its detection will be imperfect and detected real signals will contain noise and often a systematic error of comparable magnitude. In particular, tracking a time-varying signal may automatically generate a systematic error between one time period and the next because of dynamic change. There is a perceived need to be able to track changes in a signal with time. Such changes may arise for numerous reasons and in many different types of signal. Of particular interest are periodic phenomena which commonly occur in many aspects of life. For example communication signals, the sound of rotating machinery, the heartbeat and speech can all be broken down into component periodic parts.

Many modelling schemes have been used in the analysis of periodic phenomena. Such analysis admits of numerous applications: for example, subtracting periodic signal components from the acoustic spectrum of a rotating engine makes it possible to detect relatively low intensity non-periodic sounds such as those from a gearbox. Similarly if each periodic component can be isolated and ascribed to a particular single source, the operational sound of that source can be monitored. This enables early diagnosis of a failing component, indication of which would otherwise be lost amongst a cacophony of sounds. Similarly the periodic components of speech may be isolated from other sounds and spoken communication may be made in a noisy environment. Medical applications also exist: heartbeat can be analysed and harmonic interference removed from biomedical signals to enable them to be monitored. Furthermore such a representation of a complex signal requires far less bandwidth than the signal itself, and can be passed through a lower bandwidth telecommunications channel.

The prior art contains various techniques for estimating periodicities in periodic systems. Most are based on Fourier analysis which does not cope well with resolving multiple signals present in an overall received signal nor does it deal effectively with tracking time-varying periodicities or amplitudes. Fourier analysis requires an initial evaluation of a measure of likelihood for each of many possible test values of the periodicity. The range of potential periodicities is continuous and in constructing a discrete set of test values a sufficiently fine scale must be used. Generally the analysis leading to an appropriate set is performed either in the Fourier domain or indirectly by using comb filters. The use of fixed frequency Fourier components as the basis of analysis precludes ready adaptation of either technique to tracking non-stationary periodicities. Furthermore the Fourier calculation is computationally expensive making real-time analysis more difficult and any approximations result in models with a lower signal to noise ratio (SNR). The comb filter offers an improvement in terms of SNR, but still retains the basic disadvantages of a Fourier technique.

In the Fourier calculation, harmonically related Fourier components must be recombined. In general the coefficients are complex valued and so direct linear addition cannot be used to assemble the harmonic set to form the overall modelled signal. If non-coherent second order summation of the coefficients is used, it follows that this measurement is not optimised in terms of its SNR at any test value of period.

Alternatively a bank of comb filters, one filter per test value matched to a given test period, is used to reconstruct trial estimates of periodic components. Directly applied in the time domain, a comb filter may be calculated by pre-multiplying the Inverse Fourier and Fourier transforms using only those harmonic components which are relevant to a particular test value of period. The Inverse Fourier transform provides a more optimal method of recombining the harmonically related Fourier coefficients. Again a likelihood spectrum is obtained as a function of test period; in this method it is by evaluating the mean power output of each comb filter. The Fourier components are not therefore calculated explicitly and the SNR is improved when compared to the non-coherent Fourier method of the previous paragraph.

It is an object of this invention to provide a method applicable to the detection and tracking of multiple non-stationary components of a signal.

In this patent specification the term "cyclet" is used to refer to any basis component of a signal which is replicated at regular time intervals. Theoretically, the amplitude profile and repetition frequency of a cyclet are not constrained in any way. A cyclet "track" describes the variation of cyclet periodicity and amplitude profile over time.

The present invention provides a method of localising noise effects in a first signal by means of a representation thereof: a model signal comprising at least one modelled component representable by a parameter set comprising at least one model parameter characterised in that the method comprises the steps of:

(a) subtracting the model signal from the first signal to derive a residual signal;

(b) scaling the residual signal by a multiplicative pseudo-integrating factor $\rho$ having a value between zero and unity;

(c) adding the scaled residual signal obtained in Step (b) to at least a proportion of the model signal to give at least one pseudo-integrated signal, wherein perturbing noise effects in the scaled residual signal are localised.

This invention enables noise to be distinguished from systematic factors which affect signal clarity and magnitude. Potential applications of the technique used in this invention, termed pseudo-integration, are numerous. Often noise is of similar magnitude to and masks more important, systematic, signal effects. This invention provides a means of localising the effects of noise on parameter estimates and enabling information regarding systematic signal effects to be extracted.

Prior to Step (c), the model signal is preferably multiplied by $(1-\rho)$ to obtain a proportion thereof comprising at least one scaled model component for addition to the scaled residual signal. The pseudo-integrating factor $\rho$ must be less than or equal to unity, and in most applications of this technique it is of the order 0.01. The real signal is considered in this invention to be equivalent to the model signal perturbed by systematic effects and those of random noise. By scaling the residual signal, containing random noise and systematic effects, by a small factor $\rho$ and the model signal by $(1-\rho)$, peaks in the modelled signal are ~100 times the scaled level of the noise which perturbs them. Within the pseudo-integrated data the perturbing effects of noise are therefore localised to be in the vicinity of each modelled component or parameter. In general peaks within a signal which are masked by noise are not localised. Integration is required to enable such peaks to be distinguished above the effects of random noise.

The model parameter set representative of each modelled component may be corrected for systematic errors by the following additional steps:

(a) modelling the pseudo-integrated signal of each particular modelled component to obtain a corresponding set of locally perturbed model parameters;

(b) subtracting each model parameter from its corresponding locally perturbed model parameter to obtain a corresponding set of at least one localised perturbation error;

(c) rescaling each localised perturbation error back to its original level by division with the pseudo-integrating factor $\rho$; and (d) adding each rescaled localised perturbation error to its corresponding model parameter thereby obtaining a set of respective pseudo-integrated model parameters.

This extension of pseudo-integration enables systematic errors or effects to be corrected. In generating a model of a signal, inaccuracies may arise in any number of ways. Regardless of how the model is generated, it is unlikely to be a perfect replication of the signal, or any component thereof. The signal may vary with time, making past models used predictively inaccurate. The model may only be an approximation to the actual signal, and systematic errors will arise from the model's deficiencies. This feature is highly flexible in that pseudo-integrated parameters can be used to update the model, regardless of the cause of any model deficiencies.

The signal may be segmented to provide a number of signal windows, and the method is applied iteratively to generate multiple pseudo-integrated parameter sets for each modelled signal component, and a corrected parameter set is derived from such multiple parameter sets.

This feature provides the advantage that improved accuracy, speed and efficiency is obtainable in comparison with the prior art. Working in the pseudo-integration domain enables the pseudo-integrated parameters to be used to correct for model deficiencies. By generating multiple pseudo-integrated sets, more data is available with which to correct systematic errors or, equivalently, update the model. Various correction methods can be used. For example the multiple values of each pseudo-integrated parameter can be simply averaged to provide a corrected value of that parameter (smoothing). A more accurate method is to use the generated values to extrapolate to a subsequent predicted value (parameter tracking). In either case smoothing or tracking the pseudo-integrated parameter, rather than the correction to be applied to the model parameter provides a considerable improvement over the prior art. In this invention, subsequent corrections always include previously applied corrections, which results in an increase in stability and accuracy. Moreover, because a full correction can be applied, small systematic errors can be separated from noise without incurring integration lag and consequential time penalty which is inherent in prior art integration routines. Thus this application of pseudo-integration is suitable for implementation in real time signal processing.

This feature also provides the advantage that the number of model signal components and associated control parameters can be changed easily in real-time. Each can be adjusted in accordance with prevailing conditions in order to minimise bias errors and variances of the control parameters currently being used.

It will be clear that the nature of the system to which this invention is applied is not restricted. In general each of several signal components might be modelled or described by several parameters. For example, a selection from range, angle, frequency, phase, timing, temperature, rate of change, concentration, etc.

The model signal may be corrected for systematic errors by addition of the at least one corrected component thereof in turn derived from respective sets of pseudo-integrated model parameters.

The first signal is preferably a digitally sampled signal and the model signal preferably comprises previously predicted sampled signal values. This feature maintains the advantages of accuracy, speed and efficiency and lends itself to real time correction of errors between predicted and actual values of a signal. This ability to "track" a parameter is a powerful and widely applicable tool. For example complex signals which may vary rapidly with time, position or other parameter may be followed with accuracy, speed and efficiency. An approximate signal model or prediction of the signal, either in the future or at a different position can be rapidly compared with the actual collected signal at that future time or position. The systematic errors arising from inaccurate predictions can then be separated from signal noise and corrected, without the need for computationally expensive, and therefore time-consuming, signal integration.

The method of the invention may be used to correct the effect of systematic errors arising in predicted of parameters descriptive of one component of a signal exhibiting effects of noise by the steps of:

(a) predicting expected sampled signal values from previously determined parameter values;

(b) carrying out Steps (a) to (c) as set out above wherein the first signal comprises a data segment of sampled values taken from the signal exhibiting the effects of noise, the model signal comprises the expected sampled signal values obtained in Step (a) and the residual signal and pseudo-integrated signal therefore comprise residual signal sampled values and a set of pseudo-integrated data appropriate to the signal component espectively;

(c) deriving from the pseudo-integrated data set locally perturbed parameter values appropriate to the parameters descriptive of the signal component;

(d) measuring rescaled perturbation errors in each of the predicted parameter values descriptive of the model signal component from the difference between said predicted values and the locally perturbed parameter values divided by the pseudo-integrating factor $\rho$;

(e) adding the rescaled perturbation errors derived in Step (d) to the predicted parameter values o obtain pseudo-integrated parameter values; and (f) smoothing or tracking the pseudo-integrated parameter values to provide corrected parameter values.

Corrected parameter values can thus be obtained quickly from predictions without being computationally excessive. This enables tracking of rapidly varying parameter values to take place in real time, a capability not generally provided by prior art tracking routines.

The method preferably also comprises the steps of:

(a) storing the pseudo-integrated parameter values as latest values in respective history caches wherein each history cache contains previously determined respective pseudo-integrated parameter values;

(b) clearing a first parameter value from each cache; and (c) predicting new values of each corrected parameter value appropriate to future sampled values of the noisy signal by track fitting to the pseudo-integrated parameter values in each history cache and extrapolating a resulting track to future segments of sampled values.

This provides the advantage of accuracy and flexibility. Future predictions are based on curve fitting to values obtained from a number of previous segments, rather than simply smoothing, limiting the likelihood of a spurious error being propagated. Moreover the size of the history cache can be varied to suit the situation. If the parameters vary rapidly, a large history cache would result in early errors being over-weighted with a consequent undesirable lag and a short history cache is preferable. Conversely, slowly varying parameters of a signal with a small signal to noise ratio (SNR) are tracked with increased accuracy, for a given segment size, if the history cache is larger.

Tracking may be carried out in the time domain and parameter correction may account for the effect of time-varying signals. Furthermore, the track fitting of Step (c) is a linear regression procedure.

The signal is preferably a multi-component signal, and the method as described above is applied to each component thereof.

The method may be employed to separate periodic components of a digitally sampled signal by the steps of:

(a) clocking the digitised signal in segments through a detection system;

(b) following Steps (a) to (c) as first mentioned above wherein the first signal comprises the digitised signal segments the model signal comprises predicted amplitude values derived from sets of predicted model parameters, each set representing a modelled component of the signal and the residual signal and pseudo-integrated signals therefore comprise residual signal sampled values and pseudo-integrated data sets respectively;

(c) correcting errors in timing of profiles applied to the predicted amplitude values with respect to sampling times of the digitally sampled signal 30 and also tracking amplitude changes in this applied amplitude profile of each detected component using respective sets of pseudo-integrated data; and (d) searching the residual signal for new signal components.

The predicted components may be derived from detected components tracked in previously clocked segments of the digitised signal.

These features enable multiple components of a signal to be detected and separated individually. The method is iterative in that, at any one stage, all components detected up until that time are subtracted from a segment of the digitised signal to generate the residual signal. Each detected component parameter value set, descriptive of the amplitude profile and timing, is then pseudo-integrated using the residual signal in order to derive corrected parameter values (profiles and timing). The residual signal is then searched for evidence of signal components which have not yet been modelled and separated from the composite signal. Any new component detected is then modelled with a new set of parameter values and included in the next iteration of the method.

This detection method has the advantages of accuracy, speed and efficiency as compared with the prior art.

The components of the digitally sampled signal are preferably periodic components. Each periodic component is then considered in terms of its basis unit a cyclet. This embodiment enables cyclet profile amplitude and timing of the amplitude with respect to sampling rate to be followed. Each iteration of this method updates the profiles and timing to generate corrected cyclet values. This embodiment of the invention enables rapidly varying periodic components of a signal to be detected and followed in real time. Prior art analysing techniques based on Fourier transforms cannot perform acceptably when tracking rapidly varying signal components.

Preferably, Step (c) comprises the steps of:

(a) measuring a weighted averaged offset of the pseudo-integrated data set from the predicted amplitude profile of each detected periodic component and thereby deriving a scaled perturbation timing offset;

(b) dividing the weighted averaged scaled perturbation timing offset by the pseudo-integrating factor $\rho$, thereby deriving a rescaled timing error in each of the predicted amplitude values;

(c) profile fitting the pseudo-integrated data to generate a locally perturbed profile fit and deriving a set of locally perturbed profile coefficients appropriate to the profile fit;

(d) measuring a difference between each locally perturbed coefficient and a corresponding coefficient of the profile coefficients and dividing each difference by the pseudo-integrating factor $\rho$ thereby deriving a set of rescaled profile coefficient errors;

(e) adding the rescaled timing error and each rescaled profile coefficient error to the previously predicted timing and profile coefficient values to produce pseudo-integrated timing and profile coefficient values respectively;

(f) smoothing or tracking the pseudo-integrated timing and profile coefficient values to produce corrected timing and profile coefficient values respectively; and (g) predicting new values of the timing and each profile coefficient appropriate to a future incoming digitised signal segment from the corrected timing and profile coefficient values.

This embodiment of the invention provides the advantages of accuracy, speed and efficiency in detecting and tracking rapidly-varying periodic components of a signal. A parameter model suitable to describe the cyclets is provided by the total amplitude profile coefficients and timing. These model parameters are therefore pseudo-integrated in this embodiment.

Values predicted in Step (g) are preferably used to derive the predicted amplitude values, amplitude profiles and associated sets of predicted model parameters and timings used in subsequent iterations of Steps (b) and (c) detailed above in analysing a subsequently sampled signal segment.

Step (f) as described above may comprise the steps of:

(a) storing the pseudo-integrated timing and profile coefficient values as latest values in respective history caches wherein each history cache contains previously determined pseudo-integrated timing and profile coefficient values;

(b) clearing a first parameter value from each cache, and (c) predicting new values of the timing and each profile coefficient appropriate to a future incoming digitised signal segment by track fitting to the values in each history cache and extrapolating a resulting fitted track to a future segments of sampled values.

The weighted offset is preferably derived in accordance with a weighting scheme in which offsets at positions where the gradient of the amplitude profile is steep are weighted relatively strongly and those at positions where the gradient is near-zero are weighted relatively weakly.

The pseudo-integrating factor $\rho$ is preferably in the range 0.003 to 0.03.

In another aspect this invention provides a method of detecting a periodic component of a digitally sampled signal characterised in that the method comprises the steps of:

(a) filtering the sampled signal to obtain a synchronously estimated period approximating the periodicity of the periodic component;

(b) slicing the digitally sampled signal into data blocks wherein the size of each data block is equal to the synchronously estimated period;

(c) averaging inter-block in-phase amplitudes of sample points in the digitally sampled signal to obtain mean amplitude values of periodicity;

(d) subtracting the mean amplitude values from the sample point amplitudes in each data block to obtain a residual values block;

(e) scaling the residual values block in accordance with a pseudo-integrating factor $\rho$, such that the residual values are multiplied by $\rho$;

(f) adding the scaled residual values obtained in Step (e) to at least a proportion of the mean amplitude values to obtain locally perturbed amplitude values;

(g) deriving locally perturbed offsets by measuring the offsets in time of the locally perturbed amplitude values from the mean amplitude values;

(h) dividing the locally perturbed offsets by the pseudo-integration factor $\rho$ and tracking or smoothing resulting pseudo-integrated values to obtain a mean timing error line; and (i) correcting the synchronously estimated period ($\sigma$) by an amount equal to the gradient of the mean timing error line to obtain a refined estimate of the periodicity of the periodic component.

Prior to Step (f) the mean amplitude values are preferably scaled by multiplying them by $(1-\rho)$ to obtain proportions thereof for addition to the scaled residual values produced in Step (e).

In this aspect the invention provides the advantage of potential for accuracy and efficiency. A synchronous estimation followed by a local asynchronous search permits efficient acquisition and tracking of periodic signals. The invention improves SNR in comparison with Fourier harmonic analysis by profiling each periodic component using the most appropriate orthogonal basis cyclets, thereby requiring fewer degrees of freedom and hence reducing the level of noise.

In another aspect this invention provides a signal processing system characterised in that it incorporates:

(a) a transducer for transforming physical phenomena into a received signal data stream;

(b) a predictor for providing a predicted signal comprising a predicted estimate of at least one component of the received signal;

(c) a remover for subtracting the predicted signal from the received signal to generate a residual signal;

(d) an evaluator for generating a pseudo-integrated signal comprising sets of pseudo-integrated components each set corresponding to one predicted signal component and for correcting the predicted signal components using this set of pseudo-integrated components, wherein each set of pseudo-integrated components is derived from the residual signal and predicted signal components by adding at least a proportion of the predicted signal component to the respective residual signal scaled by a pseudo-integrating factor $\rho$ having a value between zero and unity; and (e) an updator for correcting the predicted signal components to produce a corrected estimate of the received signal components.

The predicted signal component is preferably scaled by multiplying it by $(1-\rho)$ to obtain the proportion thereof for addition to the scaled residual signal.

In this aspect, the invention provides a powerful signal processor capable of distinguishing noise from other factors influencing signal magnitude and clarity with computational efficiency. Potential applications of this processor are numerous: a whole range of signal factors may be extracted from a noisy signal, and parameters descriptive of each component can be selected to suit a system producing the signal.

The evaluator preferably comprises an estimator for deriving locally perturbed errors in model descriptors of each predicted signal component using each set of pseudo-integrated data and for rescaling the locally perturbed errors by dividing by the pseudo-integrating factor $\rho$; and wherein the updator is arranged to produce a corrected estimate of the received signal components by adding the rescaled locally perturbed errors to the model descriptors thereof and thereby producing a set of pseudo-integrated model descriptors and the updator is further arranged to smooth and/or track the pseudo-integrated model descriptors and thereby correct, update or predict values thereof.

The predictor may be arranged to detect at least one approximate component of an incoming signal, and the evaluator may be arranged to provide a measure of error within such approximate components and the updator is thereby arranged to generate components with improved accuracy.

The predicted signal preferably comprises predicted estimates of more than one component of the received signal and that the detection system is arranged to detect components iteratively.

The predictor may be arranged to detect approximate parameters describing an incoming signal, the evaluator may be arranged to provide a measure of error within such approximate parameters and the updator may be arranged to generate parameters with improved accuracy.

The signal components are preferably periodic components and the received signal data stream is preferably a digitally sampled data stream clocked through the system in segments.

The detection system may also include a cyclet remover arranged to generate a residual data signal from a segment of the digitally sampled data stream by subtraction from that sampled segment of sampled cyclet amplitude values appropriate to predicted periodic components, wherein said predicted periodic components represent a superposition of cyclet amplitude profiles sampled synchronously with the sampled segment.

The predictor may comprise a filterbank which in turn comprises a test set of filter sizes arranged to analyse a data stream in the time domain and generate an approximate maximum likelihood estimate of dominant periodicities of periodic components within the signal.

Each filter in the filterbank is preferably arranged to slice the received signal data stream into a non-overlapping series of data blocks, wherein each data block contains an integral number of sample points and the maximum likelihood estimator is a power spectrum averaged over of several adjacent data blocks. The filterbank may comprise a set of test periodicities, each test periodicity being a multiple of the inter-sampling period of the received signal data stream.

The system may also include cyclet quantifier arranged to identify the nature of peaks arising in the maximum likelihood spectrum and thereby to identify those which arise by way of a test periodicity approximating to an actual periodicity within the received signal data stream.

Preferably, the predicted estimates of the received signal are averaged sampled values of cyclet amplitude profiles provided by the filterbank and corresponding to peaks in a power spectrum and the remover, evaluator and updator components of the signal processor system may be arranged to produce corrected estimates of predicted cyclet amplitude profiles of dominant periodic signal components.

The system may incorporate a predictor arranged to generate a predicted estimate of a received signal on the basis of corrected estimates of previously predicted received signals generated by the updator. The received signal data stream may comprise at least one distinct time-varying component.

The system is preferably arranged to track detected signal components with time wherein the evaluator is arranged to use the pseudo-integrated data sets to correct for prediction inaccuracies in the predicted estimates of received signal components.

The signal components may be periodic components and the received signal data stream is preferably a digitally sampled data stream clocked through the system in segments.

The system may also include a cyclet remover arranged to generate a residual data signal from a segment of the digitally sampled data stream by subtraction from that sampled segment of cyclet amplitude values appropriate to predicted periodic components (cyclet amplitude profiles) sampled synchronously with the sampled segment.

The predictor may be arranged to provide a predicted estimate of the received signal in the form of predicted timing and amplitude coefficients describing an amplitude profile of each detected periodic component and the predicted cyclet amplitude values appropriate to the amplitude profiles of all detected periodic components in the time frame of an incoming data segment; and the evaluator is thereby arranged to measure errors in the predicted timing and amplitude coefficients.

In a preferred embodiment, the updator is arranged to correct the predicted timing and amplitude coefficients in accordance with the errors measured therein and so produce corrected timing and amplitude coefficients; and the tracking system is arranged therewith to predict the timing and the predicted cyclet amplitude values of each detected periodic component in a future incoming data segment and also to predict the changing amplitude profiles of each detected periodic component.

The predictor may incorporate respective history caches of previously predicted timing and amplitude coefficients and the corrected timing and amplitude coefficients wherein the predictor is arranged to curve fit tracks to values within each respective cache.

The predictor may be arranged to evaluate tracks at sampling points of a future incoming data segment and thereby to provide predicted amplitude values appropriate to the future segment and pass these predicted cyclet amplitude values to the cyclet remover.

In an alternative aspect, this invention provides a signal processing system for generating low bandwidth data from an analogue input signal characterised in that the system incorporates the tracking system as described above wherein the predicted cyclet amplitude values of each detected periodic component are extracted from the tracking system via a cyclet data output.

The system may be arranged to remove at least one dominant audio component from a multi-component audio signal characterised in that it is a first such system and it is disposed with a second such system arranged to detect selected dominant audio components, and the system being arranged to track each selected dominant audio component and including a residual signal output arranged to output a residual signal generated from a sampled input signal less the predicted amplitude values of each selected dominant audio component.

The system may be arranged to isolate at least one dominant audio component from a multi-component audio signal characterised in that it is a first such system and it is disposed with a second such system arranged to detect selected dominant audio components, the first system being arranged to track each selected dominant audio component and including a signal output channel arranged to output corrected or predicted amplitude values of each selected dominant audio component.

In order that the invention might be more fully understood, an embodiment thereof will now be described with reference to the accompanying drawings in which:

FIG. 1 is a representation of a signal generated by a single periodic source.

FIG. 2 is a representative data stream for analysis by the detection system of the invention.

Figure 3:
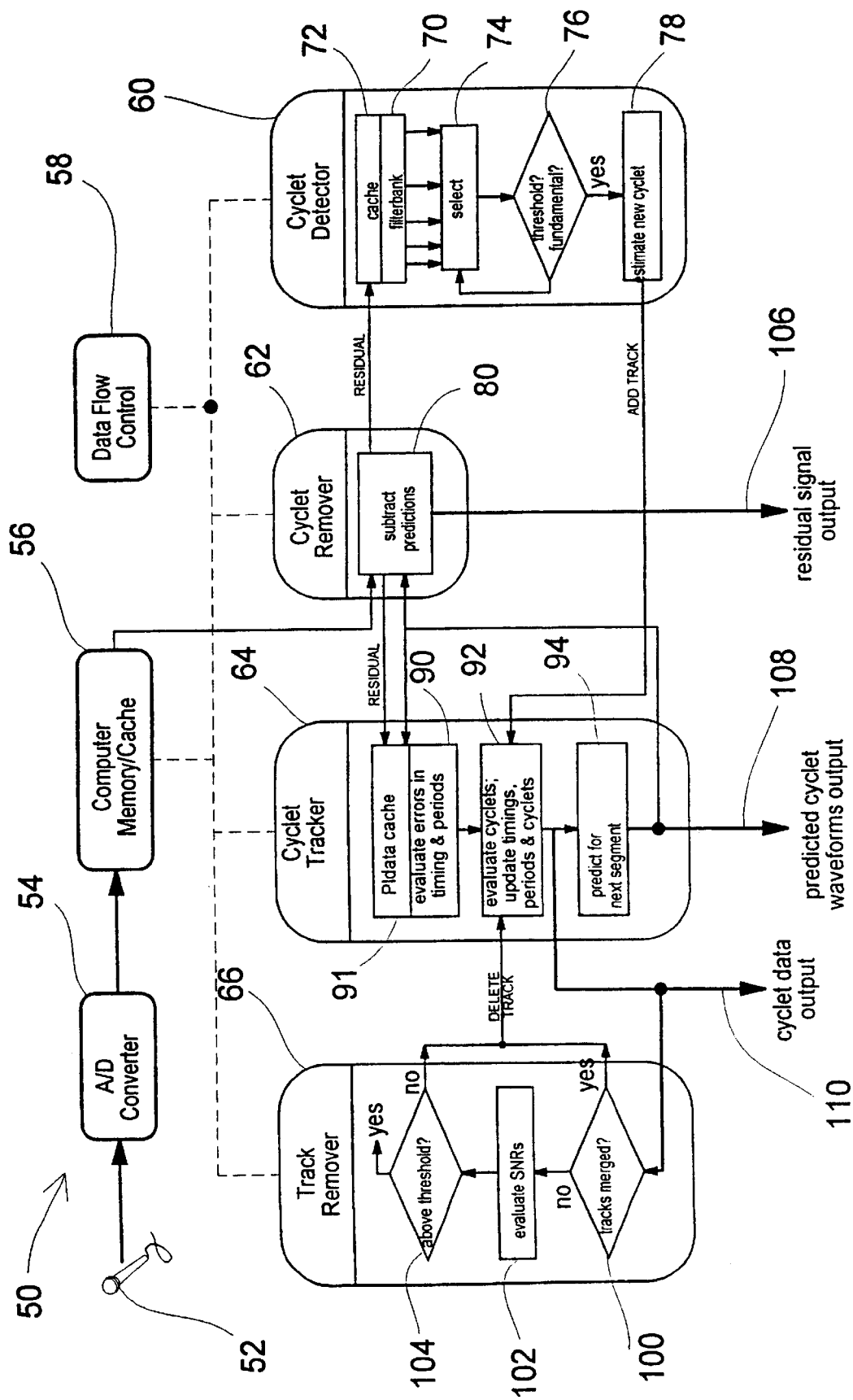
FIG. 3 is an overview of the components of the detection system.

With reference to FIG. 1, amplitude variation with time of a single periodic signal component 10 is illustrated. An asymmetric unit 12 which replicates itself after a time period $\tau$ is depicted. Each periodic signal component such as that illustrated 10 is described as a cyclet 12 which substantially repeats with periodicity $\tau$. The signal is sampled at discrete time intervals, as indicated by marks 14 along the time axis.

FIG. 2 is a representation 30 of a digitally encoded signal. Each small box such as 32 is represented as containing several bits of information (a digital word) which denotes in digital form the magnitude of the signal at each sample point 14. Each segment (alternately shaded) of twenty small boxes is a sound segment 34 and the lower arrow indicates the extent of a data segment 36: twenty six words in this particular example, but variable. The difference between data 36 and sound 34 segments will become apparent later but, in summary, the signal is input for analysis (clocked) in sound segments 34 whereas analysis of the signal is carried out on data segments 36, which may be varied depending on the stage of the analysing procedure and the actual components present in the signal.

With reference to FIG. 3, a detection system for detecting multi-periodic components of sound is indicated generally by 50. The system 50 comprises a microphone transducer 52 which detects sound signals and passes a corresponding electrical representation to an analogue to digital converter (A/D converter) 54. Digital output from the A/D converter 54 is input as a data stream to a computer where it is stored in a main cache memory 56. Data flow is regulated by a flow controller 58 which controls data input, output and analysis through four system components: a cyclet detector 60, a cyclet remover 62, a cyclet tracker 64 and a track remover 66. These four components are interconnected and each also comprises various sub-components. In particular, the cyclet detector 60 comprises a filterbank 70 which receives data via a detector cache 72, a selector 74, a cyclet quantifier 76 and an estimator 78. The cyclet remover 62 includes a prediction subtractor 80. The cyclet tracker 64 comprises an error evaluator 90, a PIdata cache 91, an updator 92 and a cyclet predictor 94. The track remover 66 comprises a merge determinator 100, SNR evaluator 102 and a track quantifier 104. These sub-components are interconnected in a manner which will become apparent in an overview of detection system operation presented below. Various outputs 106, 108, 110 from the system 50 are available: a residual signal output 106 from the cyclet remover 62, a predicted cyclet waveforms output 108 and a cyclet data output 110 from the cyclet tracker 64. These may be used variously for onward transmission, for further processing or for direct presentation to the operator.

The system 10 will be described in overview first, and a detailed description is provided later.

With reference to FIG. 3, sound associated with any phenomenon with a periodic component is detected by the microphone transducer 52. In this embodiment the source of the detected sound is taken to be rotating machinery of many parts. One skilled in the art of signal processing will appreciate that this is not a limitation on the applicability of the invention. There are many multi-component phenomena which may be analysed in accordance with this invention and the example of periodic sound components emanating specifically from rotating machinery is included by way of illustration only.

The structure of an overall sound signal (which will be termed a composite signal) from such rotating machinery is highly complex. It will contain component signals from all moving parts whether rotating, vibrating or in irregular motion. The detected signal is thus a combination of sounds from multiple sources each of which will generally have a distinctive character, intensity and periodicity. Such a composite signal is referred to as a multi-periodic signal. Moreover, neither the intensity nor periodicity of signal from any one source is likely to be constant with time: for example, consider the effect of a gear change on the sound of a car engine, and the composite signal will be further complicated by sounds from non-periodic sources and general additive noise.

Before considering the operation of the apparatus of the invention it is convenient to set a framework within which the structure of the composite sound signal can be described. The composite signal can be considered an assembly of non-periodic components, noise and replicated cyclets, each cyclet having a characteristic amplitude profile and periodicity, such as cyclet 12 with periodicity $\tau$ as illustrated in FIG. 1. This embodiment is concerned with composite signals in which some contribution is made by periodic components (cyclets), and if there is more than one such periodic contribution the composite signals are referred to as comprising multiple periodicities. In addition, the term non-stationary is used to describe a cyclet periodicity or amplitude profile that changes over time. If a cyclet is sampled discretely in time the relative position of its amplitude profile with respect to the sampling times is referred to as a timing measurement. This timing is linked to cyclet periodicity.

With reference to FIG. 3, the microphone 52 converts the composite sound signal into an electrical signal which is output to the A/D converter 54. This electrical signal is amplified and digitised by the A/D converter 54 to form a word data stream, such as that illustrated in FIG. 2, which is stored in the main cache memory 56. From this memory 56 the progress of data between the cyclet detector 60, cyclet remover 62, cyclet tracker 64 and track remover 66 is regulated by the flow controller 58.

The four components 60, 62, 64 and 66 together resolve the data stream 30 into its component periodic parts. This is done by detecting and tracking the evolution of cyclet bases. Initial cyclet detection is carried out by the cyclet detector 60 and a tracking mechanism monitors non-stationary cyclet periodicities and amplitude profiles. After detection, cyclets are extracted from the incoming data stream and a residual signal containing as yet undetected cyclets, non-periodic sounds and noise is produced. The system 50 is highly flexible in that either one or a number of cyclets can be collectively or individually monitored in isolation from the rest of the signal. Alternatively one, or a number of, cyclets can be selectively removed and the residual signal 106 comprising the remaining (periodic and non-periodic) sounds monitored. Thus in the presence of an extremely loud periodic source the cyclet(s) due to that source would be extracted from the incoming signal and the residual signal monitored via the residual signal output 106. An alternative situation may demand monitoring of one or more quiet periodic sounds isolated from the initial signal by the system 50 and output either individually or combined via the predicted cyclet waveform output 108.

Central to the operation of the cyclet tracker 64, and to some extent the cyclet detector 60, is a novel technique known as pseudo-integration. Pseudo-integration enables small systematic errors in a function to be separated from noise without incurring integration lag. It is applicable to situations in which a set of parameters are expected to change with the progress of a second variable, say time. Values of parameters are predicted for the next incoming segment of data and used to derive a residual error function from the actual incoming data. Pseudo-integration combines predicted information with the residual error function in such a way that localises the effects of noise but retains unchanged the inevitable systematic errors in the predicted values of parameters. Past predictions of parameters and the errors obtained by the pseudo-integration technique are summed and smoothed to give a "track" of each parameter by a suitable standard smoothing method such as weighted least mean squares. A history cache is continually updated with new pseudo-integrated values for each parameter which, if the localisation is reasonably close to the actual parameter value, are essentially independent of past predicted values. This flexibility is not available in the prior art Kalman filter tracking routine. This routine is unable in this retrospective manner to completely correct prediction errors thereby causing lag and bias in the parameter estimates.

The stages in the application of pseudo-integration to this embodiment can be summarised as.

1. Define a set of parameters which describe the values of real data.
2. Prior iterations of the cycle will have established previous estimates of each parameter which are stored in respective history caches each containing, say, six estimates of the respective parameter value.
3. Track fit to the si;x values in each history cache and extrapolate the tracks to predict the next (seventh) value of each parameter.
4. From these parameters calculate the values of data which are predicted to be found in the next incoming segment of data.
5. Derive residual error data by subtracting the predicted data from the actual incoming data. The residual error data will contain noise and systematic errors due to inaccuracies in the predictions.
6. Pseudo-integrate the data to generate an estimation spectrum. To carry out pseudo-integration, scale the predicted data to a level $(1-\rho)$ and add this to the residual error data scaled to a small level $(\rho)$. This avoids the inclusion of spurious maxima in the estimation spectrum caused by noise and other unpredicted components.
7. Re-estimate the values of the required parameters from the spectra of the pseudo-integrated data. The scaling levels adopted ensure that the predicted data dominates the new estimates of the parameters.

8. For each parameter find the difference between the new estimate and that predicted by and rescale this difference back to its original level by multiplying by $1/\rho$.
9. The rescaled difference is added to the predicted value and stored in the seventh position in the respective history cache and the earliest (first) value is cleared.
10. Track fit to the six values in the history cache and predict the next value as before. This ensures that in a non-stationary environment the most recent results are given the most weight.
11. Continue cycling from Step 5 to 10 and the data is said to be "being tracked"

The term "track fitting" in this specification means any suitable curve fitting routine applied to values stored in a history cache. Initially, there will be no history cache and estimates have to be made. An initial parameter set can be obtained from a detector stage where data is averaged over a suitably long period of time.

With reference to FIGS. 2 and 3, the data flow controller 58 extracts data from the main cache memory 56 in packets which are termed sound segments 34. These segments 34 are input to the detector cache 72 of the cyclet detector 60 via the cyclet remover 62. The cyclet remover 62 does not act on the incoming sound segments 34 until at least one periodic component has been detected in the data stream. Although the system 50 is clocked in sequences of sound segments 34, the cyclet detector 60 may need more or less data at various stages of its operation and consequently incorporates its own cache memory, the detector cache 72. The detector cache 72 caches the sound segments 34 and passes them to the filterbank 70 in packets which are referred to as data segments 36.

In detector operations subsequent to input to the detector cache 72, the packet size (sound segments) at which the main cache 56 outputs is irrelevant. Cyclets are detected as the data is analysed in data segments 36. With reference to FIG. 3, the filterbank 70 is essentially a set of filter sizes, each responding to a different periodicity, with which to analyse the data segments 36 and hence obtain an initial estimate of cyclet profile and periodicity.

The data segments 36 are not of constant size and are adapted by the detector cache 72 to a size appropriate to the requirements of each filter in the cyclet detector 60 at any one time. When detecting new cyclets, the detector 60 measures an average cyclet over a number of repeats and therefore requires a data segment size which contains a sufficient number of cyclet repetitions to support such averaging. In the example shown in FIG. 1, the cyclet period is contained within twelve sampling points 14. If five repeats are suitable for the averaging function, then the data segment 36 must contain at least sixty words. This corresponds to sixty small boxes 32 in the data stream representation of FIG. 2. Each sound segment 34 of this Figure corresponds to twenty small boxes 32 and therefore three such sound segments 34 are required in order to detect the cyclet 12. If another cyclet to be detected occupies fifteen sampling points, the data segment 36 with five repeats must contain at least seventy five words. This requires four sound segments 34 and so the detector cache 72 will store an additional segment 34 for filterbank use.

The filter sizes are constrained to be synchronous with the data sampling rate in that each member of the filter set has a window size which corresponds to an integral number of data words.

The data segment 36 is then "sliced", most recently received data word first, into data blocks in accordance with the test period (s) of each filter in the bank. An averaged cyclet vector and the mean cyclet power associated therewith are derived for each test period from the corresponding data blocks. This slicing and averaging is repeated across the filterbank 70 and so enables the filterbank 70 to provide a power spectrum (P(s)) across a range of test periodicities. This power spectrum provides a measure of the probability that the selection made by each filter corresponds to an actual cyclet periodicity present in the data stream.

The power spectrum (P(s)) is output from the filterbank 70 to the selector 74. The selector 74 identifies prominent peaks in the power spectrum and presents this information to the cyclet quantifier 76. The cyclet quantifier 76 determines the nature of each peak: is it above a noise threshold, is it due to "ringing" or to a sub-harmonic for which filter size is a multiple of the true cyclet period? When the quantifier 76 is satisfied that a true fundamental cyclet has been found, it passes the relevant cyclet information to an estimator 78 which is arranged to perform a local "asynchronous" refinement to obtain an accurate non-integral measure of cyclet periodicity. This asynchronous technique is not a standard technique, but based on a novel operation called pseudo-integration.

The accurate cyclet model is passed to the cyclet tracker 64 with an instruction to add this as a new track to its current list of detected cyclets. After the initial detection the cyclet tracker 64 extrapolates the accurate cyclet model to the time frame of the next incoming sound segment 34 to be clocked through the system 50. The sampling rate in subsequent sound segments will generally not be synchronised with the rate of cyclet replication and this extrapolation therefore involves an evaluation of the "phase" of the cyclet at the relevant sampling points—the timing. These predicted cyclet values of the newly-detected track are combined with cyclet values of previously detected cyclets and input to the cyclet remover 62.

In this specification the phase information will be referred to as "cyclet timing" and a timing error is accordingly generated by the cyclet tracker 64. A timing error may arise for a number of reasons: the periodicity of the source may change abruptly, the timing of the source may change abruptly, the predicted periodicity variation may be incorrect which will lead to timing errors in predicted segments, or the period may be correct but the position of the cyclet within the sound segment may be incorrect.

The cyclet tracker 64 is responsible for tracking the whole range of cyclets once the initial detection and characterisation has been made by the cyclet detector 60. In this regard, the tracker 64 compares one or more predicted cyclet profiles with cached data representing the residual signal and updates all parameters by amounts that are intended to minimise prediction errors in the next sound segment 34. The residual signal, in general, contains noise, interference and other undetected periodic components that may have intensities significantly greater than prediction errors in the cyclet profiles. The cyclet tracker 64 isolates these relatively small prediction errors in two independent stages: a pseudo-integration followed by a track fitting routine for smoothing past outputs. The resulting curves are extrapolated to the time frame of the next sound segment and are hence used to generate predictions of all relevant parameters. These estimates are available at the cyclet data output 110 and a sound data stream maintained in this compressed format is capable of being transmitted through a channel of far lower bandwidth than the original signal. The estimates are also passed to the predictor 94 where the predicted cyclet profile values are evaluated at appropriate sample times and passed to the cyclet remover 62 where a residual signal for the next sound segment is calculated. Updates to the parameters are carried out at suitable intervals. Intervals can be short with only a small cache of past outputs kept if the parameters are changing rapidly or less often with a larger history cache if parameter evolution is slow. This provides a direct means for time versus period analysis in real-time practical situations.

The cyclet remover 62 subtracts any predicted cyclet values which it receives from the tracker 64 from the actual incoming sound segment to form a residual signal. This residual signal now forms the input both to the cyclet tracker 64 and to the detector 60. This enables the cyclet tracker 64 to form a prediction for the next incoming sound segment as described above and the cyclet detector 60 to reiterate its detection cycle, also as herein described, in order to detect weaker or longer-period cyclets. The subtraction is iterative as each cyclet is detected sequentially until none remain above the limiting noise threshold. When all detectable periodicities have been cancelled, the likelihood spectrum should be near isotropic. The cyclet tracker 64 then continues to track and predict future sound segments in the time series.

Non-stationary periodicities may gain strength with time or weaken and disappear. The track remover 66 is arranged to monitor the cyclet waveforms predicted by the cyclet tracker and instruct the cyclet tracker 64 to cease applying its tracking routine to a particular cyclet should that cyclet track terminate. The output from the predicted cyclet waveform output 108 is input to the merge determinator 100 sub-component of the track remover 66. The merge determinator 100 searches for evidence of two or more tracks merging to form a single track. If such evidence is found the merge determinator 100 instructs the cyclet tracker 64 to remove one or more cyclet tracks. Non-merging tracks are passed to the SNR evaluator 102 which evaluates the signal to noise power ratio for each cyclet. The track quantifier 104 then determines whether the signal from any particular track has dropped below the noise level. The SNR evaluator 102 and track quantifier 104 are capable of detecting both the sudden disappearance of a cyclet track from the incoming segment, a situation which would arise if for example the sound source was switched off, and also the gradual fade of a cyclet amplitude profile to a weak level. In either case, an instruction is sent to the cyclet tracker 64 to remove that cyclet track.

The operation of the cyclet detector 60 will now be described in detail, beginning with the detector cache 72 and filterbank 70 sub-components. The filterbank 70 used in this specific embodiment adopts a sliding window procedure. The window lengths are measured in units of data words and constrained to be an integral number of such words. This is known as synchronous detection—an approximation is forced on the detected cyclet period in that it is assumed to be synchronous with the data sampling rate of the A/D Converter 54. The filterbank contains a set of filters each matched to a different integer-valued periodicity. Each filter uses a different selected window length containing an integral number of data words. The filter is thus performed in the time domain or, equivalently, in the domain of data words. For each window length, the segment 36 is partitioned into a series of non-overlapping data blocks and the degree of similarity (periodic correlation) between the partitioned blocks is measured. This is done by stepping the sliding window along the data segment 36 extracting each successive block and superimposing it on the sum of several previous blocks. This summation is normalised to the total number of blocks in the data segment 36 to produce an averaged cyclet profile. This averaged function is termed the cyclet vector. Coherent averaging (integration) of the data blocks will only be obtained if the test period established by the window length matches the repetition period of a periodic component within the original signal. Thus the filterbank 30 applies a test set of sliding window lengths to each data segment and generates an estimated cyclet for each window length. The cyclet vector is not itself an appropriate maximum likelihood indicator, being essentially an amplitude profile function which varies over the words in a block. To provide an appropriate indicator the filterbank 70 also calculates for each filter a value (P) indicative of the mean power in each cyclet vector, with an appropriate adjustment made for variations in the noise floor which will be described later.

During the start up phase, the sequential input of sound segments 34 to the detector cache 72 dictates the order of cyclet search. Initially, when only a few sound segments 34 are cached, the data segments 36 provided by the detector cache 72 will contain insufficient data words for the averaging process in the filterbank to be performed by filters with large window sizes i.e. long periods (s). However, as subsequent sound segments 34 are included in the detector cache 72, the data segments 36 available to the filterbank 70 comprise increasingly longer data streams enabling searches for longer period cyclets to be undertaken.

The filterbank 70 uses the computationally efficient synchronous method implemented using a standard sliding window. Its basic operation in this embodiment can be described mathematically. A cached data segment 36 passed to one of the filters corresponds to an analogue signal sampled at n discrete points and is represented as a series of n data words. These data words ($b_i$, i=1 to n) are grouped into m non-overlapping blocks ($w_j$, j=1 to m) each comprising s words where s is integer-valued and denotes the size of the sliding window and also the test period associated with the particular filter being used from the filterbank. A cyclet vector (w=$\overline{b}$(s)) for the test period s is then estimated from an average of these m blocks:

$$\text{cyclet vector} = \overline{b}(s) = \frac{\sum_{j=1}^{m} w_j}{m}$$

The s values in this averaged cyclet vector define an estimated amplitude profile for the one value of test period. The value of m is user-defined (generally 5) to provide sufficient integration and filtering.

The filterbank 70 also produces measurements of estimated mean signal to noise power ratios (SNR) of the cyclet vectors, one value per filter or test period. This is given by:

$$P(s) = \frac{\text{estimated signal power}(s)}{\text{expected noise power}(s)}$$

$$= \frac{\frac{1}{s}\sum_{i=1}^{s}\overline{b_i}(s)^2}{N(s)}$$

where i is a pointer to a word in the vector $\overline{b_i}(s)$; the estimated amplitude profile of the cyclet vector for the test period of s. Each value of P(s) defines an estimate of the relative likelihood that the test period s is a best descriptor of the input sound data stream. The most probable period is therefore obtained by comparing the output SNR of all of the filters in the filterbank 70 and searching for one or more valid maxima i.e. peaks in the spectrum P(s).

The effect of subtracting previously predicted cyclets from the input data stream before the detector searches for as yet undetected cyclets means that there is some distortion of the expected noise power spectrum N(s). The input data stream will include noise or other additive interference that is not completely suppressed by the filtering procedure. Previously predicted cyclets will include some leaked noise and this is subtracted from the incoming data stream by the cyclet remover 80, along with predicted cyclets, to provide the residual signal. The detector 60 uses this residual signal to generate a (residual) power spectrum for use in its search for other periodicities. Since any noise component leaked by the filter is also subtracted by the cyclet remover 80, this residual power spectrum contains dips below the noise level. These dips are centred on the periods (and multiples thereof) of the detected cyclets. To avoid estimation bias, the noise power spectrum N(s) is renormalised to contain dips of similar shape at the same locations. Thus, the noise power spectrum is unchanged if no cyclets have been cancelled, otherwise it is reduced, for each cyclet subtracted, by a term equivalent to the power spectrum of that cyclet scaled to an SNR of unity.

The test periodicities s used in the filterbank 70 are specified by the user in accordance with the source of the composite sound signal being analysed. The selected filterbank set should span the full range of periodicities expected in the data stream generated by that source. For increased resolution the set may, particularly at low values of period s and high values of m, include non-integer periodicities $\sigma=s+f$ where f lies between 0 and 1. Here a refers to a filter set containing both integer and non-integer filter sizes, although resulting power spectra $P(\sigma)$ are still generated by the synchronous method. Additional points in the power spectrum $P(\sigma)$ are thus generated which will aid interpolation when detecting cyclets with the smaller non-integer periodicities $\tau$. In this case the size of the sliding window is s and (as for the integer case) s sampled points are taken in each data block. However, the window then slides to positions which are multiples of $\sigma$ taking s sample points at each position. In this embodiment the filterbank 70 selects the nearest integer-value of the non-integer window position. This approximation may result in non-contiguous data blocks being averaged. Sampled points from different data blocks are overlaid and averaged as before, but there will be some error in the estimate of cyclet profile because the m sampled versions of the cyclet are not all at the same sampling phase. However, it does prevent a more serious runaway effect as the errors due to a fractional cyclet periodicity would otherwise be compounded in successive data blocks.

This shortcoming of the synchronous method, with or without the infill approximations made above mean that further refinement of cyclet characteristics is necessary when searching for non-integer periodicities $\tau$. Such refinement is done by the cyclet estimator 78 using a computationally more expensive asynchronous method.

An alternative embodiment uses the computationally more expensive comb filters in place of the synchronous averaging filterbank 70. This alternative reduces the number of degrees of freedom in the estimation process and consequently provides the potential for an improved signal to noise ratio.

The filterbank 70 outputs to the selector 74 the SNR (P) produced by each filter in its set as a function of its test periodicity ($\sigma$ words). This is referred to as a power spectrum ($P(\sigma)$). The selector 74 analyses this discrete spectrum and identifies the positions of maxima. Values of the cyclet vectors and the power spectrum ($P(\sigma)$), over the range of tested values of $\sigma$, are passed to the cyclet quantifier 76 which is arranged to determine the nature of each maximum.

In relation to each detected cyclet vector, the quantifier 76 first determines whether the power ($P(\sigma)$) of that cyclet vector, detected by the synchronous method, is above a particular pre-set threshold—the noise detection threshold. If this is the case, the quantifier 76 then assesses whether or not the detected cyclet vector is a fundamental component.

An inherent characteristic of a power spectrum evaluated as a function of test period is that it will contain a number of distinct maxima. In addition to the case of a true cyclet (of which a number may be present), these maxima may fall into one of two categories. First, some occur at sub-harmonics where for example the test period is twice or three times the true period of cyclet replication. Secondly, there may be filter leakage at other points in the spectrum due, for example, to some degree of periodicity in the cyclet itself (ringing). This may arise if the cyclet approximates a damped complex exponential. The cyclet quantifier 76 is arranged to reject maxima due to sub-harmonics, leakage and noise and select one of the valid maxima.

Noise is dealt with straightforwardly by setting the threshold level (as detailed above) above its expected maximum.

To deal with the other categories, the cyclet quantifier 76 performs a search for local maxima from short to long test periods. It will thus, of necessity, find the fundamental periodicity maximum before reaching those due to subharmonics. This is not the case for ringing effects which will produce local maxima at test periods shorter than the true cyclet repeat. Therefore each maximum is tested for likely evidence of ringing. This is done by using an increased number of data blocks with which to calculate the averaged cyclet vector. Generally, if the true cyclet repeat has been found, then increasing the number of samples in the average will increase the SNR of the power value $P(\sigma)$. If however, the repeat is due to ringing then the damped nature of the effect means that increasing the number of samples will decrease the signal and hence the value of the power $P(\sigma)$. Thus, if the SNR decreases, rather than increases, the quantifier 76 rejects this periodicity and continues its search for the next significant maximum.

The cyclet quantifier 76 thus determines whether or not an above-threshold maximum in the power spectrum is a fundamental. If it is not, then the quantifier 76, instructs the filterbank 70 to provide the next local maximum and repeats its verification test. Once the dominant fundamental within the filterbank 70 has been found, its cyclet vector and periodicity are output to the estimator 78. If no above-threshold maxima are found, there are assumed to be no further cyclets in the composite sound signal.

Generally, the periodicity of a cyclet will not be an integer multiple of the sampling interval used in the original digitisation of the signal. The synchronous method of cyclet detection and estimation performed by the filterbank 70, selector 74 and quantifier 76 will thus produce only an approximation to the true repeat and fine tuning is required. This fine tuning is carried out by the estimator 78.

The estimator 78 extracts successive data blocks in accordance with the synchronous period $\sigma$. Each data block is pseudo-integrated by subtracting the mean cyclet values (amplitude values at the word position indicated by pointer i in the cyclet vector $\bar{b}_i(\sigma)$) derived by the filterbank 70 to form a residual error data block, weighting the residual by $\rho$ and adding to the mean cyclet values weighted by $(1-\rho)$. The pseudo-integrated blocks are folded and positioned on a single plot. The superimposed cyclet amplitude profiles from successive blocks will exhibit a drift to either the left or right depending on whether the true cyclet repeat ($\tau$) is shorter or longer respectively than the synchronously estimated period ($\sigma$). A curve fitting routine is used to fit an amplitude profile to the mean value of the pseudo-integrated amplitude data within this superimposed block. Such a curve fitting routine in which an irregular profile shape is being interpolated will be referred to as a profile fit in order to distinguish it from the track fit whose purpose is extrapolation. The offsets along the abscissae of the pseudo-integrated data points from this mean amplitude profile provide a basis for a correction to the estimated test period $\sigma$. The offsets are divided by the pseudo-integrating factor $\rho$ and a linear regression approximation applied. The gradient of this fit, measured with respect to the number of the block, yields the error correction. The synchronously estimated period $\sigma$ is therefore corrected to a new non-integer period $\tau$ which is taken to be that of the cyclet. This information is passed to the cyclet tracker 64 for use in the tracking function.

By applying the periodicity constraint separately from the profile fitting routine the number of degrees of freedom can be minimised. This maximises the scope for noise reduction. In generating the power spectrum by the synchronous method, each of the s points in a cyclet vector is used. This means that s degrees of freedom contribute to the noise if smoothing is not used. In the asynchronous method however a profile fitting routine e.g. least squares fit is used. This routine has fewer degrees of freedom and consequently improves the signal to noise ratio.

In some situations it may occur that the relative sample timings from one segment to the next vary quite significantly. In such instances the scaled offsets are modulated significantly and, on rescaling, reach unacceptable levels. Near-conventional tracking could be used in this instance, but then integration lag would be a potential problem. However if there are no ambiguities in the likelihood functions, then an acceptable technique is to set the value of the pseudo-integrating factor $\rho$ to unity or close to unity in the profile fitting stage. This minimises possible coefficient modulation effects caused by asynchronous sampling.

Furthermore, profile fitting is not particularly effective when fitting a smooth curve to a transient edge near the centre of the window. In adapting the fit to the transient, the fit at points both to the left and to the right of the transient are perturbed. Accordingly, the accuracy of the curve fitting routine can be increased if the transient edge of a cyclet is positioned at the start of the window. The transient can then be excluded from the main fitting process and then either fitted separately or ignored, as required. The estimator 78 thus also performs a procedure which repositions a transient edge to the start of a window before the profile fitting routine is carried out.

The profile fitting routine used by the estimator 78 is user-definable. In this embodiment the fit is to an nth order polynomial where the cyclet amplitude profile is described by the equation:

$$y = a_0 + a_1 x + a_2 x^2 + \ldots + a_n x^n$$

where the y-values represent the cyclet amplitude and the x-values the time (data sample point) within the cyclet. The parameters $a_0, a_1, a_2, \ldots, a_n$ are termed the cyclet coefficients. From the values of the cyclet coefficients and a knowledge of the sampling points 14 of the cyclet, revised values of the cyclet vector $w = [b_0, b_1, b_2, \ldots, b_s]$, where the b values (cyclet values) are the amplitudes at s sample points in the cyclet, are deduced.

The estimator 78 then passes these accurate values of cyclet coefficients, values and periodicity along with an instruction to add a track to the cyclet tracker 64.

The detector 60 is set up to repeat the above described process of cyclet detection finding progressively weaker and longer cyclets until the noise limit is reached. Each tracked cyclet is subtracted from future incoming sound segments 34 by the cyclet remover 62, but this component cannot affect sound segments 34 already stored in the detector cache 72. The estimator 78 is therefore also arranged to extrapolate the past history of each cyclet on its initial detection and subtract this from the sound segments 34 stored in the detector cache 72. It is necessary to extrapolate back through all the cached sound segments 34 which will subsequently be used in the averaging stage of new cyclet synchronous detection. This allows previously used sound segments 34 to be reused in subsequent cyclet detections without waiting for the detector cache 72 to refill with valid residual signal data. If detected cyclets were not deleted from this data then they would still be present in the data used for averaging and their corresponding maxima would not be eliminated from the power spectrum until several more data segments had been clocked.

On initial detection of a cyclet, the past history derived by the estimator 78 is also passed to the cyclet tracker 64 with the cyclet information and instruction to add a track. The cyclet tracker 64 uses this information to extrapolate the newly-detected cyclet and predict its amplitude values within the next sound segment 34 to be input to the system 50.

In an alternative embodiment, applicable to systems in which a sound signal emanates from intermittent sources, continuous real-time data streams 30 are not received and the data is analysed in batch mode. The same data segment 36 is then repeatedly re-used until stable tracks are achieved and until no further periodic signals can be detected. The track remover 66 is redundant and is not included in such an embodiment.

In summary then, the estimator 78 refines coarse cyclet data to produce an accurate measurement of the cyclet. This is then extrapolated backwards through several sound segments 34. An instruction to add a new track and the final accurate cyclet details are passed to the cyclet tracker 64 for forward extrapolation to the next incoming sound segment 34.

The cyclet remover 62 receives the incoming sound segment 34 from the main computer cache 56 and predicted cyclet values for the incoming sound segment 34 from the cyclet tracker 64. The cyclet remover 62 subtracts the predicted values from the actual segment values to provide a residual signal data segment which it supplies to both the cyclet detector 60 and cyclet tracker 64. This residual signal is also available for output from the system 50 via the residual signal output 106. The cyclet detector 60 adds this residual signal data segment to its detector cache 72. The cyclet tracker 64 uses information within the residual to estimate errors and to track time-varying cyclet periodicities ($\tau(t)$) and amplitude profiles by exploiting pseudo-integration.

The operation of the cyclet tracker 64 will now be described in detail. The cyclet tracker 64 tracks cyclet coefficients ($a_0, a_1, \ldots, a_n$), cyclet profile amplitude values ($b_0, b_1, \ldots, b_s$) and period $\tau$ for each detected cyclet. In order to enable subtraction of detected cyclets from incoming sound segments 34, the system 50 must be capable of predicting each set of cyclet profile values ($b_0, b_1, \ldots, b_s$) for future segments. This is relatively straightforward to do once the cyclet coefficients ($a_0, a_1, \ldots, a_n$) have been determined provided that the cyclet period $\tau$ remains constant over time. However if $\tau$ is a function of time (t) then this variation has to be tracked. In this embodiment of the invention the tracking is carried out with computational efficiency by first predicting the time variation in cyclet periodicity and amplitude profile and then, when the actual data is received, measuring errors and performing corrective computations.

The following symbols will be used in this specification to identify various data segments and/or functions:

The incoming sound segment comprises p data words and is distinguished from other such segments by subscript "inc". Immediately preceding and subsequent sound segments will be labelled with the subscripts "inc−1" and "inc+1" respectively. Thus the incoming sound segment is represented by $[ss_0, ss_1, ss_2, \ldots, ss_{p-1}]_{inc}$ or, in shorthand, $[ss]_{inc}$ if sampled discretely and without brackets, $ss_{inc}$, if a continuous interpolated function is considered.

Predicted cyclet amplitude values, within these sample points are designated collectively as $$\sum_{cyclets} [b_0, b_1, b_2, \ldots, b_{p-1}]_{inc} = \left[\sum b\right]_{inc}$$

if discrete and $\Sigma b_{inc}$, if continuous cyclet profiles are used. If one particular cyclet is used as an example then the summation sign will be dropped.

The amplitude values within the residual signal data segment, following similar notation, are thus given by:

$$[r]_{inc} = [ss]_{inc} - [\Sigma b]_{inc}$$

As the cyclet is a periodic function, sampling points over a number of repeats may be folded into one repeat cycle. This will not affect the cyclet profile but, unless the cyclet period is an integral multiple of sampling intervals, will effectively provide a sampling of the cyclet at a greater number of points. The sampling times within this folded cyclet are termed the folded times.

When an instruction arrives from the cyclet detector 60 to add a track and the tracker 64 is supplied with the cyclet coefficients estimated by the detector 60 for the current sound segment, the tracker 64 predicts the amplitudes for the next segment using the relevant sampling points in the amplitude profile. Cyclet amplitude values of any previously detected cyclets are similarly deduced at the relevant sampling points, this time from the predicted cyclet coefficients generated by the tracking routine. All sets of cyclet amplitude values are input together to the cyclet remover 62.

In common with the cyclet detector 60, the cyclet tracker 64 will at times need more or less data for its operation than that provided by the clocking of sound segments 34. Fundamental to the tracking operation is the pseudo-integration technique which requires a separate cache memory, the PIdata cache 91. The updator 92 sub-component of the cyclet tracker 64 determines corrected cyclet coefficients ($a_0, a_1, \ldots, a_n)_{track}$ by means of a profile fit to the pseudo-integrated data ($[PIdata]_{inc}$) stored in the PIdata cache 91. To enable this, the updator 92 requires at least a whole cyclet of information. Moreover in order to avoid unevenly weighting the folded distribution by providing more sample points in one region of the cyclet, integral numbers of cyclet periods are used in the folding operation. This gives rise to three possible situations and consequent responses from the PIdata cache 91. If the incoming sound segment $[ss]_{inc}$ has p sampled data words and the cyclet period spans $\tau$ (not necessarily integral) samples, then, if n is an integer greater than or equal to 1, the three possibilities are:

1. $p > n\tau$
2. $p = n\tau$
3. $p < \tau$

In the first case, the $[PIdata]_{inc}$ values corresponding to all sample times within an integral number of cyclet periods are output from the cache and the remainder ($<\tau$) held back. When the subsequently processed sound segment $[ss]_{inc-1}$ is cached with these unused samples, sample times within an integral number of the cyclet repeat are output from the total $((p-n\tau)_{inc} + p_{inc+1})$ number of samples now stored in the cache 91, with any remainder again being held for use with the next sound segment $[ss]_{inc+2}$.

In the second case the PIdata cache 91 will be emptied synchronously with the clocking of the sound segments 34.

In the third case the PIdata cache 91 waits until enough sound segments have been clocked for it to have sufficient samples to cover the cyclet period and provides outputs to the evaluator 90 only after this is achieved. In the intervening sound segment times, errors in the cyclet coefficients are not evaluated but the coefficients are updated into the time frames of the intervening sound segments using the existing track information. The period and timing are similarly updated. The evaluator 90 and updator 92 therefore receive $[PIdata]_{inc}$ values covering an integral number of cyclets from the PIdata cache 91. Different periodic components are therefore generally updated at different rates.

The tracking function begins as the incoming sound segment $[ss]_{inc}$ is input to the cyclet remover. Prior cycles of the cyclet predictor 94 will have predicted cyclet amplitude values $[\Sigma b]_{inc}$ to be found in this sound segment $[ss]_{inc}$ from information derived from prior sound segments up to and including $[ss]_{inc-1}$. The PIdata cache 91 receives these predicted cyclet amplitude values $[\Sigma b]_{inc}$ along with the residual signal data segment $[r]_{inc}$ from the cyclet remover 62. For each individual cyclet being tracked, the evaluator 90 sub-component of the cyclet tracker 64 estimates a measure of timing and period errors using pseudo-integration.

To perform the pseudo-integration the evaluator 90 generates values of pseudo-integrated data known as Fldata from the predicted cyclet amplitude values and residual segment values. Specifically, the evaluator 90 evaluates:

$$[PIdata]_{inc} = (1-\rho)[\Sigma b]_{inc} + \rho[r]_{inc}$$

where $\rho$ is the pseudo-integrating factor, typically ~0.01.

The $[PIdata]_{inc}$ values are then compared with the cached amplitude values $[\Sigma b]_{inc}$ generated by the predicted cyclet coefficients ($a_0, a_1, \ldots, a_n$) at the sampling times already determined for the cached segment(s). They will be offset to a degree indicative of the timing error between the predicted cyclet amplitude values $[\Sigma b]_{inc}$ and the actual cyclet amplitude values present in the incoming sound segment $[ss]_{inc}$. The evaluator 90 therefore measures the offsets of the $[PIdata]_{inc}$ values along the ordinate (timing) axis at the cyclet amplitude values $[\Sigma b]_{inc}$. Small values of additive noise or interference near cyclet amplitude maxima will be interpreted as large timing errors. To avoid this, the time offset, in units of fractional sample interval, is weighted strongly where the gradient of the cyclet is steepest and attenuated where the gradient is near zero. The weighted offsets are averaged and multiplied by $1/\rho$. This pseudo-integrated value is indicative of the timing error relative to the predicted timing of the cyclet, i.e. it indicates systematic error in the positioning of the cyclet in the sound segment, but it is subject to noise and possible (but reduced) interference from other uncancelled components.

To further reduce noise the updator 92 stores the timing history in a sliding window history cache. This provides a record of timing for the previous q segments including both the predictions and the pseudo-integrated errors evaluated in the evaluator 90. The magnitude of q is adaptive to suit the cyclet being tracked. If the cyclet timings vary rapidly, a large history cache would result in early errors being overweighted with a consequent undesirable lag. Conversely, slowly varying cyclets are tracked with increased accuracy and SNR if the history cache is larger. For the purposes of this embodiment, a cache size of six is used and assumed adequate for the cyclet presented as an example. When the tracking procedure is instigated for the first time in relation to any particular cyclet the timing history is obtained from the estimator 78 sub-component in the cyclet detector 60. If weak highly non-stationary periodic components are expected, a more accurate initial history cache is generated by iterating the track refinement routine in the cyclet detector 60. When a new value of timing error is measured, the updator 92 removes the earliest timing estimate from the history window and replaces it with the most recent. A least squares fit is performed on this set of six timings to derive a timing function. The order of the fit may be user-defined, but generally a fit to first order, based on a linear regression approximation, suffices. Thus a timing error function with equation y=mx+c is obtained. This can be extrapolated to predict the timing in the next segment. The gradient m of the extrapolated section is a measure of the cyclet period $\tau$, allowing re-evaluation of the period for the next sound segment $[ss]_{inc++1}$. Generally the gradient will not change dramatically in the time frame of a few sound segments.

The updator 92 computes the period $\tau'$ of the cyclets in the next incoming sound segment $[ss]_{inc+1}$ and adjusts the timing to provide predicted start, finish and sampling points. The updator 92 also uses the pseudo-integrated data [PIdata] $_{inc}$ from the PIdata cache 91 to measure the systematic error in the cyclet amplitude values $[\Sigma b]_{inc}$ and in the calculated cyclet coefficients $(a_0, a_1, \ldots, a_n)_{inc}$ for each cyclet being tracked. It then updates these coefficients to predict the cyclet amplitude values in the next segment $[ss]_{inc+1}$.

To derive updated coefficients the updator 92 first fits the $[PIdata]_{inc}$ values to the general curve equation:

$$y = a_0 + a_1 x + a_2 x^2 + \ldots + a_n x^n$$

to derive a set of pseudo-integrated coefficients, $(a_0, a_1, \ldots, a_n)_{PI}$. Other curve functions may be more appropriate to other applications of this invention, but a polynomial fit is made in this embodiment. The error arising from the prediction of each member of the set of tracked cyclet coefficients $(a_0, a_1, \ldots, a_n)_{inc}$ is given by the difference between the tracked and pseudo-integrated values divided by the pseudo-integration factor $\rho$:

for each coefficient $a_L$, t=0 to n, $$\text{err}(a_t) = \frac{(a_t)_{inc} - (a_t)_{PI}}{\rho}$$

Pseudo-integrated values of the coefficients are then produced:

$$a_t' = a_t + \text{err}(a_t).$$

but, as in the timing update, the values are subject to a somewhat reduced noise.

The updator 92 stores the values of pseudo-integrated cyclet coefficients in a cyclet coefficient history. As with the timing history only a window of the most recent values is maintained, in this example a window size of six is sufficient. Separate coefficient histories are kept for each coefficient value $a_L$. A straight line fit, e.g. linear regression, is made to the values stored in each coefficient history.

For each cyclet, the track fit (regressed) coefficients for cyclet profile and timing are passed to the predictor 94.

The predictor 94 converts this track information, by extrapolating the fitted lines, into sets of cyclet coefficients $(a_0, a_1, \ldots, a_n)$ and amplitude values $$\sum_{cyclets} [b_0, b_1, b_2, \ldots, b_p]_{inc+1}$$

appropriate to the next incoming sound segment $[ss]_{inc+1}$.

The cyclet coefficients are output from the system 50 via the cyclet data output 110 and also are passed to the track remover 66. The cyclet values $[b]_{inc+1}$ are output separately via the predicted cyclet waveforms output 108 if monitoring is required and together to the cyclet remover 62 ready for subtraction from the next incoming sound segment $[ss]_{inc+1}$. They are also passed to the PIdata cache 91. If an instruction to add a cyclet track is received from the detector 60 then the predicted cyclet values for this newly-detected cyclet are combined with the tracked values in both outputs. Similarly if an instruction to delete a track is received from the track remover 66, then the $[b]_{inc+1}$ values appropriate to this cyclet are removed from both outputs.

What is claimed is:

1. A method of localising noise effects in a first signals $s_{inc}$ by means of a representation thereof: a model signal $\Sigma b_{inc}$ comprising at least one modelled component $b_{inc}$ representable by a parameter set comprising at least one model parameter $(a_0, a_1, a_2, \ldots, a_n)_{inc}$ characterised in that the method comprises the steps of:

(a) subtracting the model signal $\Sigma b_{inc}$ from the first signal $ss_{inc}$ to derive a residual signal $r_{inc}$;

(b) scaling the residual signal $r_{inc}$ by a multiplicative pseudo-integrating factor $\rho$ having a value between zero and unity;

(c) adding the scaled residual signal obtained in Step (b) to at least a proportion of the model signal $\Sigma b_{inc}$ to give at least one pseudo-integrated signal $PIdata_{inc}$, wherein perturbing noise effects in the scaled residual signal are localised.

2. A method according to claim 1 characterised in that prior to Step (c) the model signal $\Sigma b_{inc}$ is multiplied by $(1-\rho)$ to obtain a proportion thereof comprising at least one scaled model component for addition to the scaled residual signal, and characterised also in that the model parameter set $(a_0, a_1, a_2, \ldots, a_n)$ representative of each modelled component $b_{inc}$ is corrected for systematic errors by the following additional steps:

(a) modelling the pseudo-integrated signal $PIdata_{inc}$ of each particular modelled component $b_{inc}$ to obtain a corresponding set of locally perturbed model parameters $(a_0, a_1, \ldots, a_n)_{LP}$;

(b) subtracting each model parameter $(a_0, a_1, a_2, \ldots, a_n)$ from its corresponding locally perturbed model parameter $(a_0, a_1, \ldots, a_n)_{LP}$ to obtain a corresponding set of at least one localised perturbation error;

(c) rescaling each localised perturbation error by dividing it by the pseudo-integrating factor $\rho$; and (d) adding each rescaled localised perturbation error to its corresponding model parameter $(a_0, a_1, \ldots, a_n)$ thereby obtaining a set of respective pseudo-integrated model parameters $(a_0, a_1, a_2, \ldots, a_n)_{PI}$.

3. A method according to claim 2 characterised in that the signal is segmented to provide a number of signal windows $ss_{inc}, ss_{inc+1}, \ldots, ss_{inc+n}$, and the method is applied iteratively to generate multiple pseudo-integrated parameter sets $(a_0, a_1, a_2, \ldots, a_n)_{PI}$ modelling each signal component, and a corrected parameter set $(a'_0, a'_1, a'_2, \ldots, a'_n)$ is derived from such multiple parameter sets.

4. A method according to claim 2 characterised in that the model signal $\Sigma b_{inc}$ is corrected for systematic errors $\Sigma b'_{inc}$ by addition of the at least one corrected component thereof $b'_{inc}$ in turn derived from respective sets of pseudo-integrated model parameters $(a_0, a_1, a_2, \ldots, a_n)_{PI}$.

5. A method according to claim 1, characterised in that the first signal $ss_{inc}$ is a digitally sampled signal $[ss]_{inc}$ and the model signal $\Sigma b_{inc}$ comprises previously predicted sampled signal values $[\Sigma b]_{inc}$.

6. A method of localising noise effects in extracting differences between a digitally sampled signal $[ss]_{inc}$ and previously predicted sampled signal values $[\Sigma b]_{inc}$ comprising a superposition of at least one component signal $b_{inc}$, characterised in that the method comprises the steps of:

(a) subtracting the predicted signal values $[\Sigma b]_{inc}$ from the sampled signal $[ss]_{inc}$ to derive a sampled residual signal $[r]_{inc}$;

(b) scaling the residual signal [r]incin accordance with a pseudo-integrating factor $\rho$ having a value between zero and unity, such that the residual signal $[r]_{inc}$ is multiplied by $\rho$;

(c) adding the scaled residual signal obtained in Step (b) to at least a proportion of the model signal $\Sigma b_{inc}$.

7. A method according to claim 6 characterised in that prior to Step (c) the model signal $\Sigma b_{inc}$ is multiplied by $(1-\rho)$ to obtain a proportion thereof for addition to the scaled residual signal.

8. A method according to claim 2 for counteracting systematic errors characterised in that the errors are in predicted values $(a_0, a_1, \ldots, a_n)_{inc}$ of parameters descriptive of one component $b_{inc}$ of a signal exhibiting effects of noise and the method comprises the steps of:

(a) prior to Step (a) of claim 1, predicting expected sampled signal values $[\Sigma b]_{inc}$ from previously determined parameter values;

(b) carrying out Steps (a) to (c) of claim 1, wherein the first signal comprises a data segment of sampled values $[ss]_{inc}$ taken from a noise-affected signal, the model signal comprises expected sampled signal values $[\Sigma b]_{inc}$ obtained in Step (a) and the residual signal $r_{inc}$ and pseudo-integrated signal $PIdata_{inc}$ therefore comprise residual signal sampled values $[r]_{inc}$ and a set of pseudo-integrated data $[PIdata]_{inc}$ appropriate to the signal component $b_{inc}$ respectively;

(c) deriving from the pseudo-integrated data set $[PIdata]_{inc}$, locally perturbed parameter values $(a_0, a_1, \ldots, a_n)_{LP}$ appropriate to the parameters descriptive of the signal component $b_{inc}$;

(d) measuring rescaled perturbation errors $err(a_L)$ in each of the predicted parameter values $(a_0, a_1, \ldots, a_n)_{inc}$ descriptive of the model signal component $b_{inc}$ from the difference between said predicted values $(a_0, a_1, \ldots, a_n)_{inc}$ and the locally perturbed parameter values $(a_0, a_1, \ldots, a_n)_{LP}$ divided by the pseudo-integrating factor $\rho$;

(e) adding the rescaled perturbation errors $err(a_l)$ derived in Step (d) to the predicted parameter values $(a_0, a_1, \ldots, a_n)_{inc}$ to obtain pseudo-integrated parameter values $(a_0, a_1, \ldots, a_n)_{PI}$; and (f) smoothing or tracking the pseudo-integrated parameter values $(a_0, a_1, \ldots, a_n)_{PI}$ to provide corrected parameter values $(a'_0, a'_1, \ldots, a'_n)$.

9. A method according to claim 8 characterised in that it also comprises the steps of:

(a) storing the pseudo-integrated parameter values $(a_0, a_1, \ldots, a_n)_{PI}$ as latest values in respective history caches wherein each history cache contains previously determined respective pseudo-integrated parameter values;

(b) clearing a first parameter value from each cache; and (c) predicting new values of each corrected parameter value $a_L'$ appropriate to future sampled values $[ss]_{inc+1}$ of the noise-affected signal by track fitting to the pseudo-integrated parameter values in each history cache and extrapolating a resulting track to future segments of sampled values $[ss]_{inc+1}$.

10. A method according to claim 9 characterised in that tracking is carried out in the time domain and iterative parameter correction accounts for the effect of time-varying signals.

11. A method according to claim 9 characterised in that the track fitting of Step (c) is a linear regression procedure.

12. A method according to any one of claim 8 characterised in that the signal is a multi-component signal $\Sigma b_{inc}$ and the method is applied to each component $b_{inc}$ thereof.

13. A method according to claim 2 for separating components of a digitally sampled signal 30 characterised in that it includes the steps of:

(a) prior to Step (a) of claim 1, clocking the digitised signal 30 in segments $[ss]_{inc}$ through a detection system 50;

(b) carrying out Steps (a) to (c) of claim 1 wherein the first signal comprises digitised signal segments $[ss]_{inc}$, the model signal comprises predicted amplitude values $[\Sigma b]_{inc}$ derived from sets of predicted model parameters, each set $(a_0, a_1, a_2, \ldots, a_n)_{inc}$ representing a modelled component $b_{inc}$ of the signal and the residual signal $r_{inc}$ and pseudo-integrated signals $PIdata_{inc}$ therefore comprise residual signal sampled values $[r]_{inc}$ and pseudo-integrated data sets $[PIdata]_{inc}$ respectively;

(c) correcting errors in timing of profiles $b_{inc}$ applied to the predicted amplitude values $[\Sigma b]_{inc}$ with respect to sampling times of the digitally sampled signal 30 and also tracking amplitude changes in this applied amplitude profile $b_{inc}$ of each detected component using respective sets of pseudo-integrated data $[PIdata]_{inc}$; and (d) searching the residual signal $[r]_{inc}$ for new signal components.

14. A method according to claim 13 characterised in that the predicted components are derived from detected components tracked in previously clocked segments of the digitised signal 30.

15. A method according to claim 13 characterised in that the components of the digitally sampled signal 30 are periodic components.

16. A method according to claim 13 wherein the signal components are periodic components characterised in that Step (c) of claim 12 comprises the steps of:

(a) measuring a weighted averaged offset of the pseudo-integrated data set $[PIdata]_{inc}$ from the predicted amplitude profile $b_{inc}$ of each detected periodic component and thereby deriving a scaled perturbation timing offset;

(b) dividing the weighted averaged scaled perturbation timing offset by the pseudo-integrating factor $\rho$, thereby deriving a rescaled timing error in each of the predicted amplitude values $[\Sigma b]_{inc}$;

(c) profile fitting the pseudo-integrated data $[PIdata]_{inc}$ to generate a locally perturbed profile fit and deriving a set of locally perturbed profile coefficients $(a_0, a_1, \ldots, a_n)_{LP}$ appropriate to the profile fit;

(d) measuring a difference between each locally perturbed coefficient $(a_0, a_1, \ldots, a_n)_{LP}$ and a corresponding coefficient of the profile coefficients $(a_0, a_1, \ldots, a_n)_{inc}$ and dividing each difference by the pseudo-integrating factor $\rho$ thereby deriving a set of rescaled profile coefficient errors;

(e) adding the rescaled timing error and each rescaled profile coefficient error to the previously predicted timing and profile coefficient values $(a_0, a_1, \ldots, a_n)_{inc}$ to produce pseudo-integrated timing and profile coefficient values $(a_0, a_1, \ldots, a_n)_{PI}$ respectively;

(f) smoothing or tracking the pseudo-integrated timing and profile coefficient values $(a_0, a_1, \ldots, a_n)_{PI}$ to produce corrected timing and profile coefficient values respectively; and (g) predicting new values of the timing and each profile coefficient appropriate to a future incoming digitised signal segment $[ss]_{inc+1}$ from the corrected timing and profile coefficient values.

17. A method according to claim 16 characterised in that values predicted in Step (g) are used to derive the predicted amplitude values $[\Sigma b]_{inc}$ amplitude profiles $b_{inc}$ and associated sets of predicted model parameters $(a_0, a_1, a_2, \ldots, a_n)_{inc}$ and timings used in subsequent iterations of Steps (b) and (c) of claim 12 in analysing a subsequently sampled signal segment $[ss]_{inc+1}$.

18. A method according to claim 16 characterised in that Step (f) of claim 16 comprises the steps of:

(a) storing the pseudo-integrated timing and profile coefficient values $(a_0, a_1, \ldots, a_n)_{PI}$ as latest values in respective history caches wherein each history cache contains previously determined pseudo-integrated timing and profile coefficient values;

(b) clearing a first parameter value from each cache, and (c) predicting new values of the timing and each profile coefficient appropriate to a future incoming digitised signal segment $[ss]_{inc+1}$ by track fitting to the values in each history cache and extrapolating a resulting fitted track to a future segments of sampled values $[ss]_{inc+1}$.

19. A method according to claim 16, characterised in that the weighted offset is derived in accordance with a weighting scheme in which offsets at positions where the gradient of the amplitude profile is steep are weighted relatively strongly and those at positions where the gradient is near-zero are weighted relatively weakly.

20. A method according to 1 claim characterised in that the pseudo-integrating factor $\rho$ is in the range 0.003 to 0.03.

21. A method of detecting a periodic component of a digitally sampled signal 30 characterised in that the method comprises the steps of:

(a) filtering the sampled signal 30 to obtain a synchronously estimated period a approximating the periodicity $\tau$ of the periodic component;

(b) slicing the digitally sampled signal 30 into data blocks wherein the size of each data block is equal to the synchronously estimated period $\sigma$;

(c) averaging inter-block in-phase amplitudes of sample points in the digitally sampled signal 30 to obtain mean amplitude values $\bar{b}(\sigma)$ of periodicity $\sigma$;

(d) subtracting the mean amplitude values $\bar{b}(\sigma)$ from the sample point amplitudes $b_i$ in each data block to obtain a residual values block;

(e) scaling the residual values block in accordance with a pseudo-integrating factor $\rho$, such that the residual values are multiplied by $\rho$;

(f) adding the scaled residual values obtained in Step (e) to at least a proportion of the mean amplitude values $\bar{b}(\sigma)$ to obtain locally perturbed amplitude values;

(g) deriving locally perturbed offsets by measuring the offsets in time of the locally perturbed amplitude values from the mean amplitude values $\bar{b}(\sigma)$;

(h) dividing the locally perturbed offsets by the pseudo-integration factor $\rho$ and tracking or smoothing resulting pseudo-integrated values to obtain a mean timing error line; and (i) correcting the synchronously estimated period ($\sigma$) by an amount equal to the gradient of the mean timing error line to obtain a refined estimate of the periodicity $\tau$ of the periodic component.

22. A method according to claim 21 characterised in that prior to Step (f) the mean amplitude values $\bar{b}(\sigma)$ are scaled by multiplying them by $(1-\rho)$ to obtain proportions thereof for addition to the scaled residual values produced in Step (e).

23. A signal processing system characterised in that it incorporates:

(a) a transducer 54, 56 for transforming physical phenomena into a received signal data stream $ss_{inc}$, 30;

(b) a predictor 70, 72, 94 for providing a predicted signal comprising a predicted estimate of at least one component $\Sigma b_{inc}$, $\bar{b}(s)$ of the received signal $\bar{b}(s)$ $ss_{inc}$;

(c) a remover 62, 78 for subtracting the predicted signal $\Sigma b_{inc}$, $\bar{b}(s)$ from the received signal $ss_{inc}$ to generate a residual signal $r_{inc}$;

(d) an evaluator 90, 78 for generating a pseudo-integrated signal comprising sets of pseudo-integrated components $PIdata_{inc}$, each set corresponding to one predicted signal component $\Sigma b_{inc}$, $\bar{b}(s)$ and for correcting the predicted signal components using this set of pseudo-integrated components, wherein each set of pseudo-integrated components $PIdata_{inc}$ is derived from the residual signal $r_{inc}$ and predicted signal components $\Sigma b_{inc}$, $\bar{b}(s)$ by adding at least a proportion of the predicted signal component $\Sigma b_{inc}$, $\bar{b}(s)$ to the respective residual signal $r_{inc}$ scaled by a pseudo-integrating factor $\rho$ having a value between zero and unity; and (e) an updator 92, 78 for correcting the predicted signal components $\Sigma b_{inc}$, $\bar{b}(s)$ to produce a corrected estimate of the received signal components $\Sigma b'_{inc}$, $\bar{b}'(\tau)$.

24. A signal processing system according to claim 23 characterised in that the predicted signal component $\Sigma b_{inc}$, $\bar{b}(s)$ is scaled by multiplying it by $(1-\rho)$ to obtain the proportion thereof for addition to the scaled residual signal $r_{inc}$.

25. A signal processing system according to claim 24 characterised in that the evaluator 90, 78 comprises an estimator for deriving locally perturbed errors in model descriptors $(a_0, a_1, a_2, \ldots, a_n)_{inc}$, s of each predicted signal component $b_{inc}$ using each set of pseudo-integrated data $PIdata_{inc}$ and for rescaling the locally perturbed errors by dividing by the pseudo-integrating factor $\rho$; and wherein the updator 92, 78 is arranged to produce a corrected estimate of the received signal components $\Sigma b'_{inc}$, $\bar{b}'(\tau)$ by adding the rescaled locally perturbed errors to the model descriptors $(a_0, a_1, a_2, \ldots, a_n)_{inc}$, s thereof and thereby producing a set of pseudo-integrated model descriptors $(a_0, a_1, a_2, \ldots, a_n)_{PI}$ and the updator is further arranged to smooth and/or track the pseudo-integrated model descriptors $(a_0, a_1, a_2, \ldots, a_n)_{inc}$ and thereby correct, update or predict values thereof $(a_0, a_1, a_2, \ldots, a_n)_{inc+1}$.

26. A signal processing system according to claim 24 characterised in that the predictor 70, 72 is arranged to detect at least one approximate component $\Sigma b_{inc}(s)$ of an incoming signal $ss_{inc}$, and the evaluator 90 is arranged to provide a measure of error within such approximate components and the updator 78 is thereby arranged to generate components with improved accuracy $\Sigma b'_{inc}(\tau)$.

27. A signal processing system according to claim 26 characterised in that the predicted signal comprises predicted estimates of more than one component $\Sigma b_{inc}$, $\overline{b}(s)$ of the received signal and that the detection system is arranged to detect components iteratively.

28. A signal processing system according to claim 24 wherein the predictor 70, 72 is arranged to detect approximate parameters $b_{inc}(a_0, a_1, a_2, \ldots, a_n, s)$ describing an incoming signal $ss_{inc}$, and the evaluator 90 is arranged to provide a measure of error within such approximate parameters and the updator 78 is thereby arranged to generate parameters with improved accuracy $b'_{inc}(a'_0, a'_1, a'_2, \ldots, a'_n, \tau)$.

29. A signal processing system according to claim 27 characterised in that the signal components $b_{inc}(\tau)$ are periodic components.

30. A signal processing system according to according to claim 29 characterised in that the received signal data stream 30 is a digitally sampled data stream clocked through the system in segments $[ss]_{inc}$.

31. A signal processing system according to claim 30 characterised in that it also includes a cyclet remover 62 arranged to generate a residual data signal $[r]_{inc}$ from a segment $[ss]_{inc}$ of the digitally sampled data stream by subtraction from that sampled segment $[ss]_{inc}$ of sampled cyclet amplitude values $[\Sigma b]_{inc}$ appropriate to predicted periodic components $\Sigma b_{inc}$, wherein said predicted periodic components $\Sigma b_{inc}$ represent a superposition of cyclet amplitude profiles $b_{inc}$, sampled synchronously with the sampled segment $[ss]_{inc}$.

32. A signal processing system according to claim 31 characterised in that the predictor 70, 72 comprises a filterbank 70 comprising a test set of filter sizes arranged to analyse a data stream $ss_{ins}$, $r_{inc}$ in the time domain and generate an approximate maximum likelihood estimate of dominant periodicities of periodic components within the signal $ss_{inc}$, $r_{inc}$.

33. A signal processing system according to claim 31 characterised in that each filter in the filterbank 70 is arranged to slice the received signal data stream 30 into a non-overlapping series of data blocks, wherein each data block contains an integral number s of sample points and the maximum likelihood estimator is a power spectrum $P(\sigma)$ wherein P is the average power per sampled signal contained in an average of several adjacent data blocks of size $\sigma$.

34. A signal processing system according to claim 33 characterised in that the filter bank 70 comprises a set of test periodicities s, each test periodicity s being a multiple of the inter-sampling period of the received signal data stream 30.

35. A signal processing system according to claim 33 characterised in that the system includes a cyclet quantifier 76 arranged to identify the nature of peaks arising in the maximum likelihood spectrum $P(\sigma)$ and thereby to identify those which arise by way of the test periodicity $\sigma$ being an approximation to an actual periodicity $\tau$ within the received signal data stream 30.

36. A signal processing system according to claim 33, characterised in that the predicted estimates of the received signal are averaged sampled values of cyclet amplitude profiles $[\Sigma b(\sigma)_{inc}]$ provided by the filterbank 70 and corresponding to peaks in the power spectrum $P(\sigma)$ and the remover 78, evaluator 78 and updator 78 components of the signal processor system of claim 24 are thereby arranged to produce corrected estimates of predicted cyclet amplitude profiles $[\Sigma b'(\tau)_{inc}]$ of dominant periodic signal components.

37. A signal processing system according to claim 24 characterised in that the predictor 94 is arranged to generate the predicted estimate of the received signal $\Sigma b_{inc}$ on the basis of corrected estimates of previously predicted received signals $\Sigma b'_{inc-1}$ generated by the updator 92.

38. A signal processing system according to claim 37 characterised in that the received signal data stream $ss_{inc}$, 30 comprises at least one distinct time-varying component $b_{inc}$.

39. A signal processing system according to claim 38 characterised in that its arranged to track detected signal components $\Sigma b_{inc}$ with time wherein the evaluator 90 is arranged to use the pseudo-integrated data sets $PIdata_{inc}$ to correct for prediction inaccuracies in the predicted estimates of received signal components $\Sigma b_{inc}$.

40. A signal processing system according to claim 38 characterised in that the signal components $b_{inc}(\tau)$ are periodic components.

41. A signal processing system according to claim 40 characterised in that the received signal data stream 30 is a digitally sampled data stream clocked through the system in segments $[ss]_{inc}$.

42. A signal processing system according to claim 41 characterised in that it also includes a cyclet remover 62 arranged to generate a residual data signal $[r]_{inc}$ from a segment $[ss]_{inc}$ of the digitally sampled data stream by subtraction from that sampled segment $[ss]_{inc}$ of cyclet amplitude values $[\Sigma b]_{inc}$ appropriate to predicted periodic components $\Sigma b_{inc}$ (cyclet amplitude profiles) sampled synchronously with the sampled segment $[ss]_{inc}$.

43. A signal processing system according to claim 42 characterised in that the predictor 94 is arranged to provide a predicted estimate of the received signal $\Sigma b_{inc}$ in the form of predicted timing $\tau$ and amplitude coefficients $(a_0, a_1, \ldots, a_n)_{inc}$ describing an amplitude profile $b_{inc}$ of each detected periodic component and the predicted cyclet amplitude values $[\Sigma b]_{inc}$ appropriate to the amplitude profiles $\Sigma b_{inc}$ of all detected periodic components in the time frame of an incoming data segment; and the evaluator 90 is thereby arranged to measure errors in the predicted timing and amplitude coefficients $(a_0, a_1, \ldots, a_n)_{inc}$.

44. A signal processing system according to claim 43 characterised in that the updator 92 is arranged to correct the predicted timing $\tau$ and amplitude coefficients $(a_0, a_1, \ldots, a_n)_{inc}$ in accordance with the errors measured therein and so produce corrected timing and amplitude coefficients; and the tracking system is arranged therewith to predict the timing and the predicted cyclet amplitude values $[\Sigma b]_{inc+1}$ of each detected periodic component in a future incoming data segment and also to predict the changing amplitude profiles $b_{inc+1}$ of each detected periodic component.

45. A signal processing system according to claim 44 characterised in the predictor 94 incorporates respective history caches of previously predicted timing and amplitude coefficients and the corrected timing and amplitude coefficients wherein the predictor 94 is arranged to curve fit tracks to values within each respective cache.

46. A signal processing system according to claim 44 characterised in that the predictor 94 is arranged to evaluate the tracks at the sampling points of the future incoming data segment and thereby to provide the predicted amplitude values $[b]_{inc+1}$ appropriate to the future segment and pass these predicted cyclet amplitude values $[b]_{inc+1}$ to the cyclet remover 62.

47. A signal processing system according to claim 40 characterised in that it also incorporates a track remover 66 arranged to evaluate the signal to noise ratio of detected signal components $b_{inc}(\tau)$ and the system is arranged to remove any such component from subsequently generated predicted estimates of received signal components $\Sigma b_{inc}$ when its signal to noise ratio falls below a threshold value.

48. A signal processing system according to claim 44 for generating low bandwidth data from an analogue input signal characterised in that it includes a cyclet data output 110 for extracting predicted cyclet amplitude values $[\Sigma b]_{inc+1}$ of each detected periodic component.

49. A signal processing system according to claim 42 for removing at least one dominant audio component from a multi-component audio signal characterised in that it is a first such system and it is disposed with a second such system arranged to detect selected dominant audio components, and the system being arranged to track each selected dominant audio component and including a residual signal output 106 arranged to output a residual signal $r_{inc}$ generated from a sampled input signal $[ss_{inc}]$ less the predicted amplitude values $[\Sigma b]_{inc}$ of each selected dominant audio component, and the second system incorporating:

(a) a second transducer 54, 56 for transforming physical phenomena into a received signal data stream $ss_{inc}$, 30;

(b) a second predictor 70, 72, 94 for providing a predicted signal comprising a predicted estimate of at least one approximate component $\Sigma b_{inc}(s)$ of an incoming signal $ss_{inc}$, and the evaluator 90 is arranged to provide a measure of error within such approximate components and the updator 78 is thereby arranged to generate components with improved accuracy $\Sigma b'_{inc}(\tau)$;

(c) a second remover 62, 78 for subtracting the predicted signal $\Sigma b_{inc}$, $\overline{b}(s)$ from the received signal $ss_{inc}$ to generate a residual signal $r_{inc}$;

(d) a second evaluator 90, 78 for generating a pseudo-integrated signal comprising sets of pseudo-integrated components $PIdata_{inc}$, each set corresponding to one predicted signal component $b_{inc}$, $\overline{b}(s)$ $\overline{b}(s)$ $\overline{b}(s)$ and for correcting the predicted signal components using this set of pseudo-integrated components, wherein each set of pseudo-integrated components $PIdata_{inc}$ is derived from the residual signal $r_{inc}$ and predicted signal components $\Sigma b_{inc}$, $\overline{b}(s)$ by adding together the residual signal $r_{inc}$ scaled by a pseudo-integrating factor $\rho$ and the respective predicted signal component $\Sigma b_{inc}$, $\overline{b}(s)$ scaled by a factor $(1-\rho)$;

(e) a second estimator is incorporated in the evaluator 90, 78 for deriving locally perturbed errors in model descriptors $(a_0, a_1, a_2, \ldots, a_n)_{inc}$, s of each predicted signal component $b_{inc}$ using each set of pseudo-integrated data $PIdata_{inc}$ and for rescaling the locally perturbed errors by dividing by the pseudo-integrating factor $\rho$; and (f) a second updator 92, 78 arranged to produce a corrected estimate of received signal components $\Sigma b'_{inc}$, $\overline{b}'(\tau)$ by adding rescaled locally perturbed errors to model descriptors $(a_0, a_1, a_2, \ldots, a_n)_{inc}$, s thereof and thereby producing a set of pseudo-integrated model descriptors $(a_0, a_1, a_2, \ldots, a_n)_{PI}$ and to smooth and/or track the pseudo-integrated model descriptors $(a_0, a_1, a_2, \ldots, a_n)_{inc}$ and thereby correct, update or predict values thereof $(a_0, a_1, a_2, \ldots, a_n)_{inc+1}$.

50. A signal processing system according to claim 42 for isolating at least one dominant audio component from a multi-component audio signal characterised in that it is a first such system and it is disposed with a second such system arranged to detect selected dominant audio components, the first system being arranged to track each selected dominant audio component and including a signal output channel 108, 110 arranged to output corrected or predicted amplitude values $[\Sigma b]_{inc}$ $[\Sigma b]_{inc+1}$ of each selected dominant audio component, and the second system incorporating:

(a) a second transducer 54, 56 for transforming physical phenomena into a received signal data stream $ss_{inc}$, 30;

(b) a second predictor 70, 72, 94 for providing a predicted signal comprising a predicted estimate of at least one approximate component $\Sigma b_{inc}(s)$ of an incoming signal $ss_{inc}$, and the evaluator 90 is arranged to provide a measure of error within such approximate components and the updator 78 is thereby arranged to generate components with improved accuracy $\Sigma b'_{inc}(\tau)$;

(c) a second remover 62, 78 for subtracting the predicted signal $\Sigma b_{inc}$, $\overline{b}(s)$ from the received signal $ss_{inc}$ to generate a residual signal $r_{inc}$;

(d) a second evaluator 90, 78 for generating a pseudo-integrated signal comprising sets of pseudo-integrated components $PIdata_{inc}$, each set corresponding to one predicted signal component $b_{inc}$, $\overline{b}(s)$ $\overline{b}(s)$ $\overline{b}(s)$ and for correcting the predicted signal components using this set of pseudo-integrated components, wherein each set of pseudo-integrated components $PIdata_{inc}$ is derived from the residual signal $r_{inc}$ and predicted signal components $\Sigma b_{inc}$, $\overline{b}(s)$ by adding together the residual signal $r_{inc}$ scaled by a pseudo-integrating factor $\rho$ and the respective predicted signal component $\Sigma b_{inc}$, $\overline{b}(s)$ scaled by a factor $(1-\rho)$;

(e) a second estimator is incorporated in the evaluator 90, 78 for deriving locally perturbed errors in model descriptors $(a_0, a_1, a_2, \ldots, a_n)_{inc}$, s of each predicted signal component $b_{inc}$ using each set of pseudo-integrated data $PIdata_{inc}$ and for rescaling the locally perturbed errors by dividing by the pseudo-integrating factor $\rho$;

(f) a second updator 92, 78 arranged to produce a corrected estimate of received signal components $\Sigma b'_{inc}$, $\overline{b}'(\tau)$ by adding rescaled locally perturbed errors to model descriptors $(a_0, a_1, a_2, \ldots, a_n)_{inc}$, s thereof and thereby producing a set of pseudo-integrated model descriptors $(a_0, a_1, a_2, \ldots, a_n)_{PI}$ and to smooth and/or track the pseudo-integrated model descriptors $(a_0, a_1, a_2, \ldots, a_n)_{inc}$ and thereby correct, update or predict values thereof $(a_0, a_1, a_2, \ldots, a_n)_{inc+1}$.

* * * * *